(12) United States Patent
Clavelle et al.

(10) Patent No.: US 9,270,225 B2
(45) Date of Patent: Feb. 23, 2016

(54) CONCENTRATING SOLAR ENERGY COLLECTOR

(71) Applicant: Cogenra Solar, Inc., Mountain View, CA (US)

(72) Inventors: Adam T. Clavelle, San Francisco, CA (US); Jason C. Kalus, San Francisco, CA (US); Nathan P. Beckett, Oakland, CA (US); Ratson Morad, Palo Alto, CA (US); Gilad Almogy, Palo Alto, CA (US)

(73) Assignee: SunPower Corporation, San Jose, CA (US)

( * ) Notice: Subject to any disclaimer, the term of this patent is extended or adjusted under 35 U.S.C. 154(b) by 435 days.

(21) Appl. No.: 13/740,770

(22) Filed: Jan. 14, 2013

(65) Prior Publication Data

US 2014/0196764 A1    Jul. 17, 2014

(51) Int. Cl.
| | |
|---|---|
| *H01L 31/00* | (2006.01) |
| *H01L 31/042* | (2014.01) |
| *H02N 6/00* | (2006.01) |
| *F24J 2/10* | (2006.01) |
| *F24J 2/12* | (2006.01) |
| *F24J 2/14* | (2006.01) |
| *H02S 20/30* | (2014.01) |
| *H01L 31/054* | (2014.01) |
| *H01L 31/052* | (2014.01) |
| *H02S 40/44* | (2014.01) |

(Continued)

(52) U.S. Cl.
CPC . *H02S 20/32* (2014.12); *F24J 2/10* (2013.01); *F24J 2/12* (2013.01); *F24J 2/14* (2013.01); *H01L 31/052* (2013.01); *H01L 31/0521* (2013.01); *H01L 31/0547* (2014.12); *H02S 20/10* (2014.12); *H02S 20/30* (2014.12); *H02S 40/22* (2014.12); *H02S 40/44* (2014.12); *Y02E 10/40* (2013.01); *Y02E 10/50* (2013.01); *Y02E 10/52* (2013.01)

(58) Field of Classification Search
CPC ......... H02S 20/00; H02S 20/30; H02S 20/32; H02S 40/44; Y02E 10/52; F24J 2/10; F24J 2/12; F24J 2/14; H01L 31/0547; H01L 31/052; H01L 31/0521
USPC .......................... 136/244, 246, 248, 252, 259
See application file for complete search history.

(56) References Cited

U.S. PATENT DOCUMENTS

| | | |
|---|---|---|
| 3,490,950 A | 1/1970 | Myer |
| 3,769,091 A | 10/1973 | Leinkram et al. |

(Continued)

FOREIGN PATENT DOCUMENTS

| | | |
|---|---|---|
| DE | 20 2011 103 199 U1 | 2/2012 |
| WO | WO 99-42765 | 8/1999 |

(Continued)

OTHER PUBLICATIONS

EP107249385 Response to Written Opinion 161/162 filed Jul. 23, 2012.

(Continued)

*Primary Examiner* — Jonathan Johnson
*Assistant Examiner* — Lindsey Bernier
(74) *Attorney, Agent, or Firm* — Innovation Counsel LLP

(57) ABSTRACT

Systems, methods, and apparatus by which solar energy may be collected to provide electricity, heat, or a combination of electricity and heat are disclosed herein.

43 Claims, 24 Drawing Sheets

(51) Int. Cl.
  *H02S 40/22* (2014.01)
  *H02S 20/10* (2014.01)

(56) References Cited

U.S. PATENT DOCUMENTS

| | | | |
|---|---|---|---|
| 3,988,166 A | 10/1976 | Beam | |
| 4,002,031 A | 1/1977 | Bell | |
| 4,038,971 A | 8/1977 | Bezborodko | |
| 4,078,544 A | 3/1978 | Hollands et al. | |
| 4,178,913 A | 12/1979 | Hutchison | |
| 4,180,414 A | 12/1979 | Diamond et al. | |
| 4,243,019 A | 1/1981 | Severson | |
| 4,249,514 A | 2/1981 | Jones | |
| 4,281,900 A | 8/1981 | Lewis, Jr. | |
| 4,296,737 A | 10/1981 | Silk | |
| 4,332,238 A | 6/1982 | Garcia, Jr. | |
| 4,337,758 A | 7/1982 | Meinel et al. | |
| 4,351,319 A | 9/1982 | Robbins, Jr. | |
| 4,361,717 A | 11/1982 | Gilmore et al. | |
| 4,386,600 A * | 6/1983 | Eggert, Jr. | 359/852 |
| 4,388,481 A | 6/1983 | Uroshevich | |
| 4,422,443 A | 12/1983 | Arendt | |
| 4,422,893 A | 12/1983 | Duchateau et al. | |
| 4,427,838 A | 1/1984 | Goldman | |
| 4,435,043 A | 3/1984 | Mertens et al. | |
| 4,454,371 A | 6/1984 | Folino | |
| 4,719,904 A | 1/1988 | O'Neill | |
| 4,771,764 A | 9/1988 | Cluff | |
| 4,846,151 A | 7/1989 | Simko, Jr. | |
| 4,877,959 A | 10/1989 | Page | |
| 5,054,466 A | 10/1991 | White et al. | |
| 5,191,876 A | 3/1993 | Atchley | |
| 5,253,637 A | 10/1993 | Maiden | |
| 5,344,497 A | 9/1994 | Fraas et al. | |
| 5,401,329 A | 3/1995 | Fraas et al. | |
| 5,498,297 A | 3/1996 | O'Neill et al. | |
| 5,505,789 A | 4/1996 | Fraas et al. | |
| 5,505,917 A | 4/1996 | Collier, Jr. | |
| 5,542,409 A | 8/1996 | Sampayo | |
| 5,616,185 A | 4/1997 | Kukulka | |
| 5,660,644 A * | 8/1997 | Clemens | 136/245 |
| 5,994,641 A | 11/1999 | Kardauskas et al. | |
| 6,020,555 A | 2/2000 | Garboushian et al. | |
| 6,080,927 A | 6/2000 | Johnson | |
| 6,082,353 A | 7/2000 | Van Doorn et al. | |
| 6,123,067 A | 9/2000 | Warrick | |
| 6,218,605 B1 | 4/2001 | Daily et al. | |
| 6,232,545 B1 | 5/2001 | Samaras et al. | |
| 6,276,359 B1 | 8/2001 | Frazier | |
| 6,303,853 B1 | 10/2001 | Fraas et al. | |
| 6,946,081 B2 | 9/2005 | Voutchkov | |
| 7,388,146 B2 | 6/2008 | Fraas et al. | |
| 7,709,730 B2 | 5/2010 | Johnson et al. | |
| 7,772,484 B2 | 8/2010 | Li et al. | |
| 7,820,906 B2 | 10/2010 | Johnson et al. | |
| 7,825,327 B2 | 11/2010 | Johnson et al. | |
| 7,926,480 B2 | 4/2011 | LeLievre | |
| 7,932,461 B2 | 4/2011 | Johnson et al. | |
| 7,952,057 B2 | 5/2011 | Finot et al. | |
| 7,968,791 B2 | 6/2011 | Do et al. | |
| 8,039,777 B2 | 10/2011 | Lance et al. | |
| 8,049,150 B2 | 11/2011 | Johnson et al. | |
| 8,071,930 B2 | 12/2011 | Wylie et al. | |
| 8,083,362 B2 | 12/2011 | Finot et al. | |
| 8,134,104 B2 | 3/2012 | Finot et al. | |
| 8,410,351 B1 | 4/2013 | Gu | |
| 2001/0017154 A1 | 8/2001 | Washio | |
| 2003/0024802 A1 | 2/2003 | Burgos | |
| 2003/0121228 A1 | 7/2003 | Stoehr et al. | |
| 2003/0201008 A1 | 10/2003 | Lawheed | |
| 2004/0055594 A1 | 3/2004 | Hochberg et al. | |
| 2004/0093965 A1 | 5/2004 | Hardcastle, III | |
| 2005/0081910 A1 | 4/2005 | Danielson et al. | |
| 2005/0133082 A1 | 6/2005 | Konold et al. | |
| 2006/0016772 A1 | 1/2006 | Presher et al. | |
| 2006/0150967 A1 | 7/2006 | Hoelle et al. | |
| 2006/0231133 A1 | 10/2006 | Fork et al. | |
| 2006/0249143 A1 | 11/2006 | Straka | |
| 2007/0034207 A1 | 2/2007 | Niedermeyer | |
| 2007/0056579 A1 | 3/2007 | Straka | |
| 2007/0068162 A1 | 3/2007 | Komura et al. | |
| 2007/0089775 A1 | 4/2007 | Lasich | |
| 2007/0175871 A1 | 8/2007 | Brezni et al. | |
| 2007/0251569 A1 | 11/2007 | Shan et al. | |
| 2008/0053701 A1 | 3/2008 | Antaya et al. | |
| 2008/0127967 A1 | 6/2008 | Kimura et al. | |
| 2008/0271776 A1 | 11/2008 | Morgan | |
| 2008/0302357 A1 | 12/2008 | DeNault | |
| 2008/0302418 A1 | 12/2008 | Buller et al. | |
| 2008/0308091 A1 | 12/2008 | Corio | |
| 2008/0308094 A1 | 12/2008 | Johnston | |
| 2009/0000662 A1 | 1/2009 | Harwood et al. | |
| 2009/0014058 A1 | 1/2009 | Croft et al. | |
| 2009/0056698 A1 | 3/2009 | Johnson et al. | |
| 2009/0056785 A1 | 3/2009 | Johnson et al. | |
| 2009/0056786 A1 | 3/2009 | Johnson et al. | |
| 2009/0056787 A1 | 3/2009 | Johnson et al. | |
| 2009/0065045 A1 | 3/2009 | Tsadka et al. | |
| 2009/0114261 A1 | 5/2009 | Stancel et al. | |
| 2009/0114281 A1 | 5/2009 | Gobel | |
| 2009/0126774 A1 | 5/2009 | Taylor et al. | |
| 2009/0173375 A1 | 7/2009 | Frazier et al. | |
| 2009/0178704 A1 | 7/2009 | Kalejs et al. | |
| 2009/0183731 A1 | 7/2009 | Capan | |
| 2009/0211644 A1 | 8/2009 | Wylie et al. | |
| 2009/0235975 A1 | 9/2009 | Shingleton | |
| 2009/0308379 A1 | 12/2009 | Capan | |
| 2009/0314283 A1 | 12/2009 | Kimura et al. | |
| 2010/0000165 A1 | 1/2010 | Koller | |
| 2010/0031991 A1 | 2/2010 | Mochizuki et al. | |
| 2010/0089435 A1 | 4/2010 | Lockenhoff | |
| 2010/0126554 A1 | 5/2010 | Morgan et al. | |
| 2010/0132776 A1 | 6/2010 | Nakata | |
| 2010/0147347 A1 | 6/2010 | Dyreby et al. | |
| 2010/0163014 A1 | 7/2010 | Johnson et al. | |
| 2010/0170501 A1 | 7/2010 | Albritton | |
| 2010/0193014 A1 | 8/2010 | Johnson et al. | |
| 2010/0207951 A1 | 8/2010 | Plaisted et al. | |
| 2010/0218807 A1 | 9/2010 | Arbore et al. | |
| 2010/0236626 A1 | 9/2010 | Finot et al. | |
| 2010/0288332 A1 | 11/2010 | O'Neill et al. | |
| 2010/0294336 A1 | 11/2010 | Johnson et al. | |
| 2010/0319684 A1 * | 12/2010 | Almogy et al. | 126/714 |
| 2011/0017267 A1 | 1/2011 | Lichy et al. | |
| 2011/0023940 A1 | 2/2011 | Do et al. | |
| 2011/0036345 A1 | 2/2011 | Almogy et al. | |
| 2011/0061719 A1 | 3/2011 | Tsadka et al. | |
| 2011/0108090 A1 | 5/2011 | Lance et al. | |
| 2011/0114154 A1 | 5/2011 | Lichy et al. | |
| 2011/0132457 A1 | 6/2011 | Finot | |
| 2011/0162692 A1 | 7/2011 | Giacalone et al. | |
| 2011/0168161 A1 | 7/2011 | Capan | |
| 2011/0220096 A1 | 9/2011 | Margankunte et al. | |
| 2011/0226309 A1 | 9/2011 | Do et al. | |
| 2011/0226310 A1 | 9/2011 | Johnson et al. | |
| 2011/0265869 A1 | 11/2011 | Finot et al. | |
| 2011/0271999 A1 | 11/2011 | Almogy et al. | |
| 2011/0279918 A1 | 11/2011 | Almogy et al. | |
| 2011/0284055 A1 | 11/2011 | Almogy et al. | |
| 2012/0042932 A1 | 2/2012 | Wylie et al. | |
| 2012/0318318 A1 | 12/2012 | Metin et al. | |
| 2012/0318319 A1 | 12/2012 | Pinarbasi et al. | |
| 2012/0325282 A1 | 12/2012 | Snow et al. | |
| 2013/0112237 A1 | 5/2013 | Almogy et al. | |
| 2013/0265665 A1 | 10/2013 | Clavelle et al. | |
| 2014/0102510 A1 | 4/2014 | Kalus et al. | |
| 2014/0261632 A1 * | 9/2014 | Clavelle et al. | 136/248 |

FOREIGN PATENT DOCUMENTS

| | | |
|---|---|---|
| WO | WO 03022578 A1 | 3/2003 |
| WO | WO 2005-057092 A1 | 6/2005 |
| WO | WO 2005-090873 A1 | 9/2005 |
| WO | WO 2006-000834 A1 | 1/2006 |

(56) References Cited

FOREIGN PATENT DOCUMENTS

| | | |
|---|---|---|
| WO | WO 2006-120475 A1 | 11/2006 |
| WO | WO 2007-022756 A2 | 3/2007 |
| WO | WO 2007-087680 A1 | 8/2007 |
| WO | WO 2007-109900 A1 | 10/2007 |
| WO | WO 2007-110713 A1 | 10/2007 |
| WO | WO 2007-129146 A1 | 11/2007 |
| WO | WO 2008-105913 A2 | 9/2008 |
| WO | WO 2008-112180 A9 | 9/2008 |
| WO | WO 2008-143482 A2 | 11/2008 |
| WO | WO 2009-002350 A1 | 12/2008 |
| WO | WO 2009-011013 | 1/2009 |
| WO | WO 2009-029275 A2 | 3/2009 |
| WO | WO 2009-032917 A2 | 3/2009 |
| WO | WO 2009-032920 A2 | 3/2009 |
| WO | WO 2009-034573 A2 | 3/2009 |
| WO | WO 2009-061495 A1 | 5/2009 |
| WO | WO 2009-076740 A1 | 6/2009 |
| WO | WO 2009-090538 A2 | 7/2009 |
| WO | WO 2009-096754 A2 | 8/2009 |
| WO | WO 2009-103077 A2 | 8/2009 |
| WO | 2009/121174 A1 | 10/2009 |
| WO | WO 2009-137864 A1 | 11/2009 |
| WO | WO 2009-146215 A2 | 12/2009 |
| WO | WO 2010-004420 A2 | 1/2010 |
| WO | WO 2010-017422 A2 | 2/2010 |
| WO | WO 2010-035064 A1 | 4/2010 |
| WO | WO 2010-047656 A1 | 4/2010 |
| WO | WO 2010-048677 A1 | 5/2010 |
| WO | 2010/081130 A2 | 7/2010 |
| WO | WO 2010-096001 A1 | 8/2010 |
| WO | WO 2010-099236 A1 | 9/2010 |
| WO | WO 2010-108141 A2 | 9/2010 |
| WO | WO 2010-132312 A1 | 11/2010 |
| WO | WO 2010-138606 A2 | 12/2010 |
| WO | WO 2011-014690 A2 | 2/2011 |
| WO | WO 2011-062902 A1 | 5/2011 |
| WO | WO 2011-069079 A2 | 6/2011 |
| WO | WO 2011-134759 A2 | 11/2011 |
| WO | WO 2011-139494 A1 | 11/2011 |
| WO | WO 2011-139852 A2 | 11/2011 |
| WO | WO 2011-141198 A2 | 11/2011 |
| WO | WO 2011-146177 A1 | 11/2011 |
| WO | WO 2011-149589 A1 | 12/2011 |
| WO | 2012/004812 A2 | 1/2012 |
| WO | WO 2012-003235 A1 | 1/2012 |
| WO | WO 2012-005747 A1 | 1/2012 |
| WO | WO 2012-113478 A1 | 8/2012 |

OTHER PUBLICATIONS

PCT/US/2010/025280 International Search Report and Written Opinion, mailing date May 3, 2010; 6 pp.
PCT/US/2010/56847 International Preliminary Report and Written Opinion mailing date May 31, 2012.
PCT/US/2010/56847 International Search Report and Written Opinion mailing date Mar. 21, 2011; 11 pp.
PCT/US2010/025280 International Preliminary Report and Written Opinion, mailing date Sep. 9, 2011; 5 pp.
PCT/US2010/036220 International Preliminary Report on Patentability and Written Opinion mailing Nov. 29, 2011; 8 pp.
PCT/US2010/036220 International Search Report and Written Opinion mailing date Jun. 20, 2011; 12 pp.
PCT/US2011/031117 International Preliminary Report on Patentability and Written Opinion mailing date Nov. 27, 2012; 17 pp.
PCT/US2011/031117 International Search Report 4pp. and Written Opinion 16pp; mailing date Jun. 20, 2011; 20 pp.
PCT/US2011/032163 International Preliminary Report on Patentability and Written Opinion mailing date Nov. 6, 2012; 13 pp.
PCT/US2011/032163 International Search Report and Written Opinion mailing date Jun. 27, 2011; 21 pp.
PCT/US2011/032169 International Preliminary Report on Patentability and Written Opinion mailing date Nov. 20, 2012; 17 pp.
PCT/US2011/032169 International Search Report and Written Opinion mailing date Jul. 5, 2011; 24 pp.
PCT/US2013/034383 International Search Report and Written Opinion mailing date Jun. 28, 2013.
U.S. Appl. No. 12/622,416 Office Action mailed Nov. 23, 2010.
U.S. Appl. No. 12/622,416 Amendment filed Apr. 18, 2011.
U.S. Appl. No. 12/622,416 Office Action mailed Jun. 21, 2011.
U.S. Appl. No. 12/622,416 RCE and Amendment filed Dec. 21, 2011.
U.S. Appl. No. 12/712,122 Interview Summary mailed Apr. 9, 2013.
U.S. Appl. No. 12/712,122 Office Action mailed Nov. 30, 2012.
U.S. Appl. No. 12/774,436 Office Action dated Dec. 7, 2012.
U.S. Appl. No. 12/774,436 Amendment dated Jun. 6, 2013.
U.S. Appl. No. 12/781,706 Office Action dated Apr. 25, 2013.
U.S. Appl. No. 12/788,048 Amendment filed Jun. 18, 2012.
U.S. Appl. No. 12/788,048 Office Action mailed Jan. 18, 2012.
U.S. Appl. No. 12/788,048 Office Action mailed Nov. 8, 2012.
U.S. Appl. No. 12/788,048 RCE and Amendment filed May 8, 2013.
U.S. Appl. No. 12/887,958 Office Action mailed Mar. 14, 2012.
U.S. Appl. No. 12/912,177 Amendment filed Jul. 13, 2012.
U.S. Appl. No. 12/912,177 Amendment filed Jun. 18, 2012.
U.S. Appl. No. 12/912,177 Office Action mailed Jan. 17, 2012.
U.S. Appl. No. 12/912,177 Office Action mailed Jun. 25, 2012.
U.S. Appl. No. 13/079,193 Office Action dated May 1, 2013.
Affolter, Pascal, et al., PVT Roadmap, Accessed from the world wide web Jan. 3, 2010, 91 pgs.
Anderson, William G., et al., Heat Pipe Cooling of Concentrating Photovoltaic (CPV) Systems, $6^{th}$ International Energy Conversion Engineering Conference (IECEC), Jul. 28-30, 2008, pp. 1-9.
Birkmire, R. W., et al., Processing Materials, Devices and Diagnostics for Thin Film Photovoltaics: Fundamental and Manufacturability Issues, Annual Report to National Renewable Energy Laboratory by Institute of Energy Conversion University of Delaware, Apr. 1, 2007-Dec. 31, 2007, pp. 1-77.
Boehm, Robert, CPV—Competing and Beating Other Solar Technologies, CPV Today $2^{nd}$ Concentrated Photovoltaic Summit USA, Feb. 2-3, 2010, 62 pgs.
Bunea, Marius M., et al., Simulation and Characterization of High Efficiency Back Contact Cells for Low-Concentration Photovoltaics; Photovoltaic Specialists Conference (PVSC), 2010 35th IEEE; Jun. 20-25, 2010; pp. 000873-000876, ISSN: 0160-8371; Print ISBN: 978-1-4244-5890-S; Honolulu, HI.
Chow, T.T., A review on photovoltaic/thermal hybrid solar technology, Applied Energy, Feb. 2010, pp. 365-379, available online Jul. 25, 2009.
Cohen, Gilbert E., et al., Final Report on the Operation and Maintenance Improvement Program for Concentrating Solar Power Plants, Jun. 1999, pp. 1-186, issued by Sandia National Laboratories.
Cohen, Gilbert, et al., Parabolic Trough Concentrator Development, USA Trough Third Annual Parabolic Trough Workshop, Jun. 18, 2000, pp. 1-13.
Combined Heat and Power Solar (CHAPS), brochure, Nov. 2004, 2 pgs., Australian National University Centre for Sustainable Energy Systems.
Coventry, Franklin J., et al., Thermal and electrical performance of a concentrating PV/Thermal collector: results from the ANU CHAPS collector, 2002, 6 pgs., ANZSES Solar Energy Conference, Newcastle, Australia.
CPV Systems: The Road to Successful Deployments, CPV Today $2^{nd}$ Concentrated Photovoltaic Summit—US, Feb. 2-3, 2010, 11 pgs.
Crowley, Mark, Commercialization of CPV in 2010—Toward the First 100 MW, CPV Today $2^{nd}$ Concentrated Photovoltaic Summit US, Feb. 2-3, 2010, 17 pgs.
Etzkorn, Edward V., DOE Outlook and Opportunities for CPV, CPV Today $2^{nd}$ Concentrated Photovoltaic Summit—US, Feb. 2, 2010, 33 pgs.
Fraas, Dr. Lewis, Economic Comparisons of the Various PV Options, CPV Today Concentrated Photovoltaics Summit USA, Feb. 4, 2009, 21 pgs.
Fraas, Lewis, Concentrated Photovoltaics (CPV): Path to Affordable Solar Electric Power, Southeast Solar Summit, Nov. 2007, 22 pgs.
Grama, Sorin, et al., Concentrating Solar Power—Technology, Cost, and Markets, 2008 Industry Report, 2008, 149 pgs, Prometheus Institute for Sustainable Development and Greentech Media; Part 1.

(56) References Cited

OTHER PUBLICATIONS

Grama, Sorin, et al., Concentrating Solar Power—Technology, Cost, and Markets, 2008 Industry Report, 2008, 149 pgs, Prometheus Institute for Sustainable Development and Greentech Media; Part 2.
Harwood, D., et al., Receiver Development for Rooftop Concentrator Applications, International Conference on Solar Concentrators (ICSC-4), 2007, 4 pgs.
Hittite Solar Energy; Pages from http://www.hittitesolarenergy.com; Accessed on Feb. 7, 2013; 6 pp.
Judkins, Zachary S., et al.; Performance Results of a Low-Concentration Photovoltaic System Based on High Efficiency Back Contact Cells; 25th European Photovoltaic Solar Energy Conference and Exhibition / 5th World Conference on Photovoltaic Energy. Conversion; Sep. 6-10, 2010; pp. 123-127; Valencia Spain.
Kaminar, N.R., et al., PVMaT Improvements in the Manufacturing of the PVI Powergrid, Final Technical Report, Oct. 1999, 77 pgs.
Kempe, M.D., et al., Accelerated Stress Testing of Hydrocarbon-Based Encapsulants for Medium-Concentration CPV Applications, $34^{th}$ IEEE Photovoltaic Specialists Conference (PVSC), Jun. 7-12, 2009, pp. 1826-1831.
Kempe, M.D., et al., Ethylene-Vinyl Acetate Potential Problems for Photovoltaic Packaging, 2006 IEEE $4^{th}$ World Conference on Photovoltaic Energy Conversion (WCPEC-4), May 7-12, 2006, 6 pgs.
Kennedy, Cheryl, Session CSP Advanced Systems: Optical Materials, 2008 Solar Annual Review Meeting, 27 pgs.
Laila S. Mattos, et al.; New Module Efficiency Record: 23.5% under 1-Sun Illumination Using Thin-film Single-junction GaAs Solar Cells; 38th IEEE PVSC Jun. 3-8, 2012; Alta Devices, Inc., Santa Clara, CA USA; pp. 003187-003190.
Le Lievre, Peter, Chromasun Photovoltaic; Heating-Cooling; Daylighting—all in a single panel, Cleantech Showcase—Abu Dhabi, Jan. 21, 2009, 21 pgs.
Lee, B., et al., Thermally conductive and electrically insulating EVA composite encapsulants for solar photovoltaic (PV) cell, Express Polymer Letters, 2008, pp. 357-363, vol. 2, No. 5.
Lerchenmuller, Hansjorg, CPV Super Panel—The CPV Landscape, CPV Today $2^{nd}$ Concentrated Photovoltaic Summit—US, Feb. 2, 2010, 21 pgs.
Lupfert, Eckhard, Eurotrough Design Issues and Prototype Testing at PSA, Proceedings of the Solar Forum 2001, Solar Energy: The Power to Choose, Apr. 21-25, 2001, 5 pgs.
Mason, N.B. et al., Advanced Laser Processing for Industrial Solar Cell Manufacturing, 2006, 62 pgs, Department of Trade and Industry (United Kingdom).
Mathur, S. S., et al.; Geometrical Designs and Performance Analysis of a Linear Fresnel Reflector Solar Concentrator With a Flat Horizontal Absorber; International Journal of Energy Research, vol. 14, pp. 107-124; 1990; Jan. 18, 1989, John Wiley & Sons, Ltd.
Meydbray, Y., et al., Solder Joint Degradation in High Efficiency All Back Contact Solar Cells, Proceedings of the $22^{nd}$ European Photovoltaic Solar Energy Conference, 2007, 5 pgs.
Miller, D.C., et al., Analysis of Transmitted Optical Spectrum Enabling Accelerated Testing of CPV Designs, SPIE 2009 Solar Energy + Technology Conference, Aug. 2-6, 2009, Jul. 2009 preprint, 15 pgs.
Mirroxx Linear Fresnel Collector Technology, (brochure), 2009, 8 pgs.
Morvillo, Pasquale, The ENEA c-Si high efficiency solar cell, Tutorial on PV-Concentrators Technology, 2007, 32 pgs.
Neuhaus, Dirk-Holger, et al., Industrial Silicon Wafer Solar Cells, Advances in OptoElectronics, 2007, pp. 1-15, Hindawi Publishing Corporation.

O'Neill, Mark, Fifth-Generation 20X Linear Fresnel Lens Silicon Cell Concentrator Technology, Fifth International Conference on Solar Concentrators (ICSC-5), Nov. 19, 2008, pp. 1-23.
Plesniak, Adam, Deployment and Performance of Boeing HCPV Modules and Arrays, CPV Today $2^{nd}$ Concentrated Photovoltaic Summit—, Feb. 3, 2010, 18 pgs.
Price, Hank, et al., Advances in Parabolic Trough Solar Power Technology, Journal of Solar Energy Engineering, May 2002, pp. 109-125, vol. 124.
Renewable Energy Technology Characterizations, Topical Report TR-109496, Dec. 1997, 283 pgs, Office of Utility Technologies, Energy Efficiency and Renewable Energy, U.S. Department of Energy and Electric Power Research Institute.
Royne, Anja, et al., Cooling of Photovoltaic cells under concentrated illumination: a critical review, Solar Energy Materials & Solar Cells, 2005, pp. 451-483, vol. 86, Elsevier.
Sala, G., et al., 480 kW peak EUCLIDES Concentrator Power Plant Using Parabolic Troughs, $2^{nd}$ World Conference and Exhibition PVSEC, 1998, pp. 1963-1968.
Sala, G., et al., Test, Rating and Specification of PV Concentrator Components and Systems, Book 1, Classification of PV Concentrators, Chapter 3—History of Concentrators, Jan. 31, 2002, pp. 1, 13-57.
Shisler, Bill, CPV Qualification and Safety Testing, CPV Today $2^{nd}$ Concentrated Photovoltaic Summit—US, Feb. 3, 2010, 19 pgs.
Skumanich, Andy, CPV: Market Considerations for 2010 and Beyond, CPV Conference Feb. 3, 2010, 31 pgs.
SkyFuel & SkyTrough Questions and Answers, (brochure), 2009, 6 pgs, www.SkyFuel.com.
SkyTrough Parabolic Trough Collector Assembly, (brochure), 2 pgs., www.Skyfuel.com.
SkyTrough Parabolic Trough Concentrator, (brochure), 2009, 2 pgs., www.SkyFuel.com.
Smeltink, J. et al., Performance monitoring of a pv thermal concentrator system, $22^{nd}$ EU PVSEC, 2007, 4 pgs.
Smeltink, J., et al., A hybrid pv-thermal linear microconcentrator for domestic application, $22^{nd}$ EU PVSEC, 2007, 4 pgs.
Smeltink, J.F.H, et al., A 40Kw Roof Mounted PV Thermal Concentrator System, $20^{th}$ EC PV Solar Energy Conference, Mar. 27, 2006, 4 pgs.
Smeltink, J.F.H., et al., 40kW PV Thermal Roof Mounted Concentrator System, Conference Record of the 2006 IEEE $4^{th}$ World Conference on Photovoltaic Energy Conversion, May 2006, pp. 636-639.
Swanson, Richard M., The Promise of Concentrators, Progress in Photovoltaics: Research and Applications, 2000, pp. 93-111, John Wiley & Sons, Ltd.
Tobias, Ignacio, et al., Handbook of Photovoltaic Science and Engineering, Chapter 7—Crystalline Silicon Solar Cells and Modules, 2003, pp. 255-306, 2003 John Wiley & Sons, Ltd.
U.S. Appl. No. 13/763,412 Office Action dated May 21, 2013.
U.S. Appl. No. 13/763,429 Office Action dated May 23, 2013.
Van Kessel, Theodore, Thermal Management for CPV at 2000 Suns, CPV Today $2^{nd}$ Concentrated Photovoltaic Summit—US, Feb. 2-3, 2010, 36 pgs.
Weatherby, Clive, Solar CPV—a great opportunity for traditional manufacturing industry, CPV Today Concentrated Photovoltaic Summit USA, Feb. 3-4, 2009, pp. 1-33.
Youssef, Cherif, Utility's Perspective to Concentrated Solar..., CPV Today $2^{nd}$ Annual Concentrated Photovoltaic Summit USA, Feb. 2, 2010, 28 pgs.
Zondag, Herbert, et al., Guidelines for performance measurements of liquid-cooled non-concentrating PVT collectors using c-Si cells, 2006, pp. 1-41, issued by PV Catapult.
PCT International Search Report, PCT/US14/11319, Jul. 11, 2014, 4 pages.

* cited by examiner

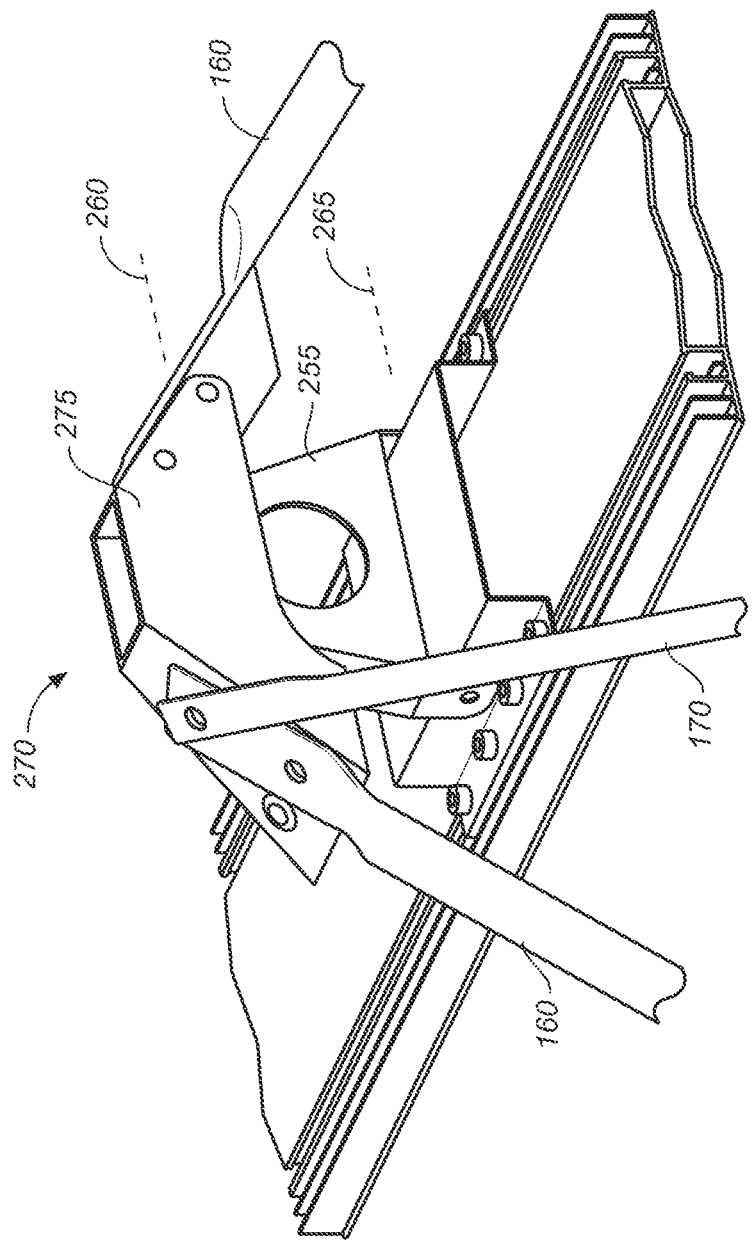

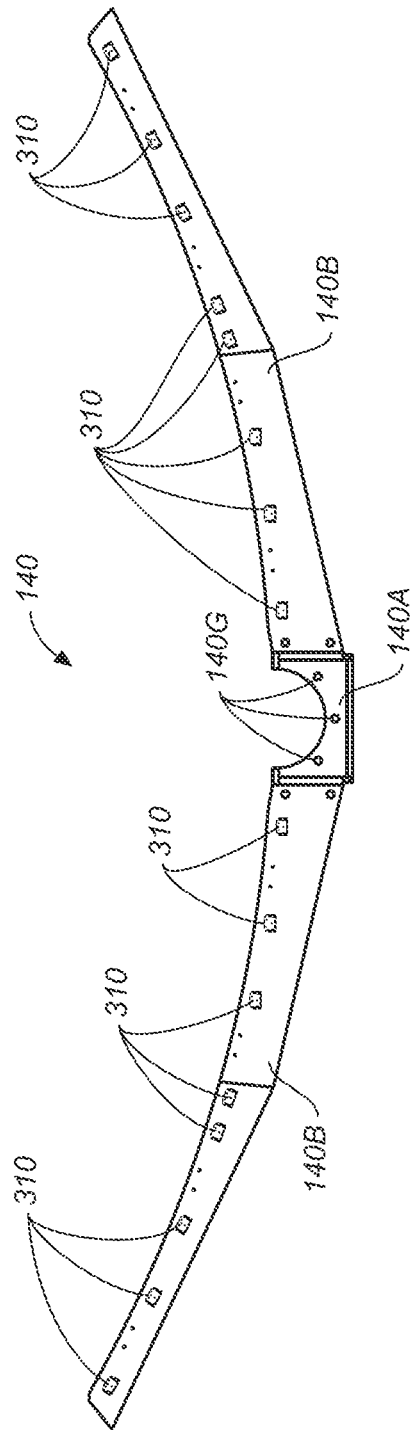
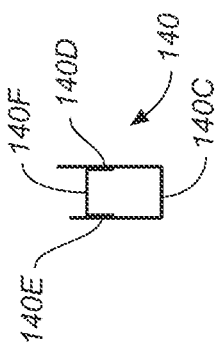
FIG. 7A
FIG. 7B

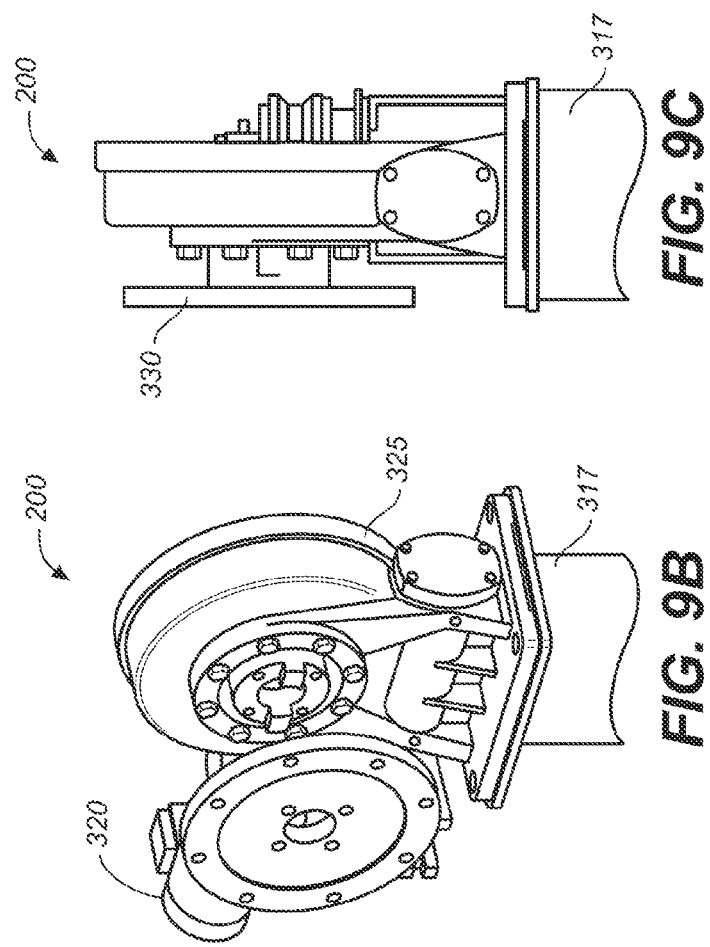
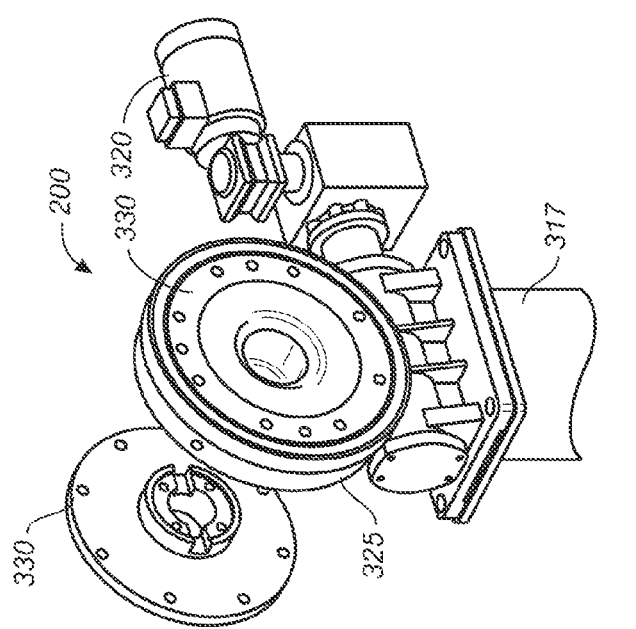
FIG. 9A
FIG. 9B
FIG. 9C

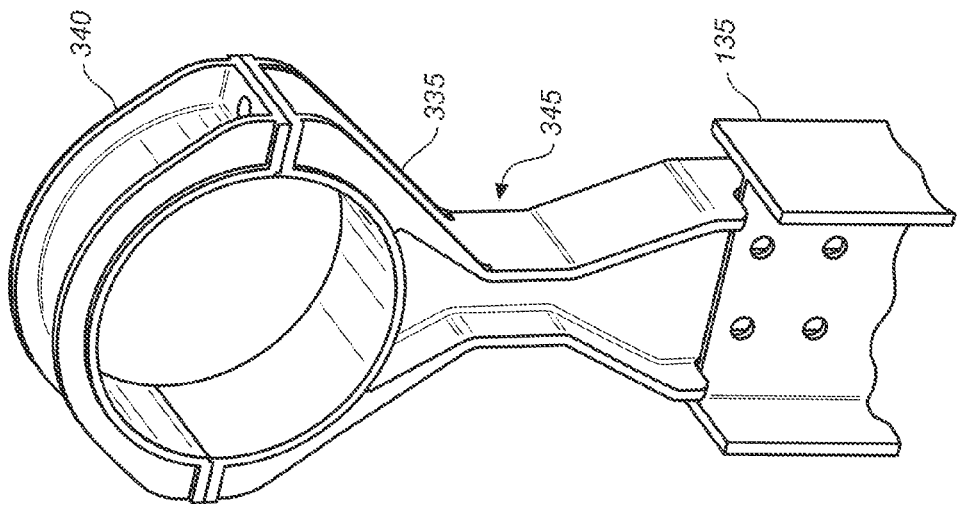
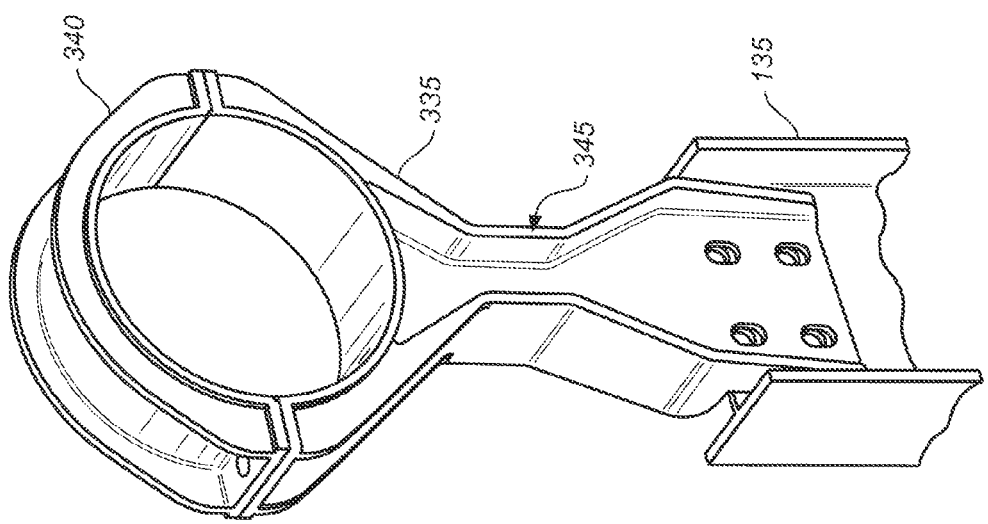
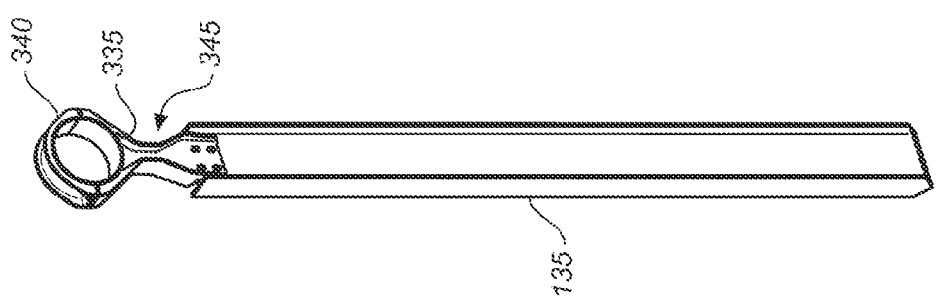

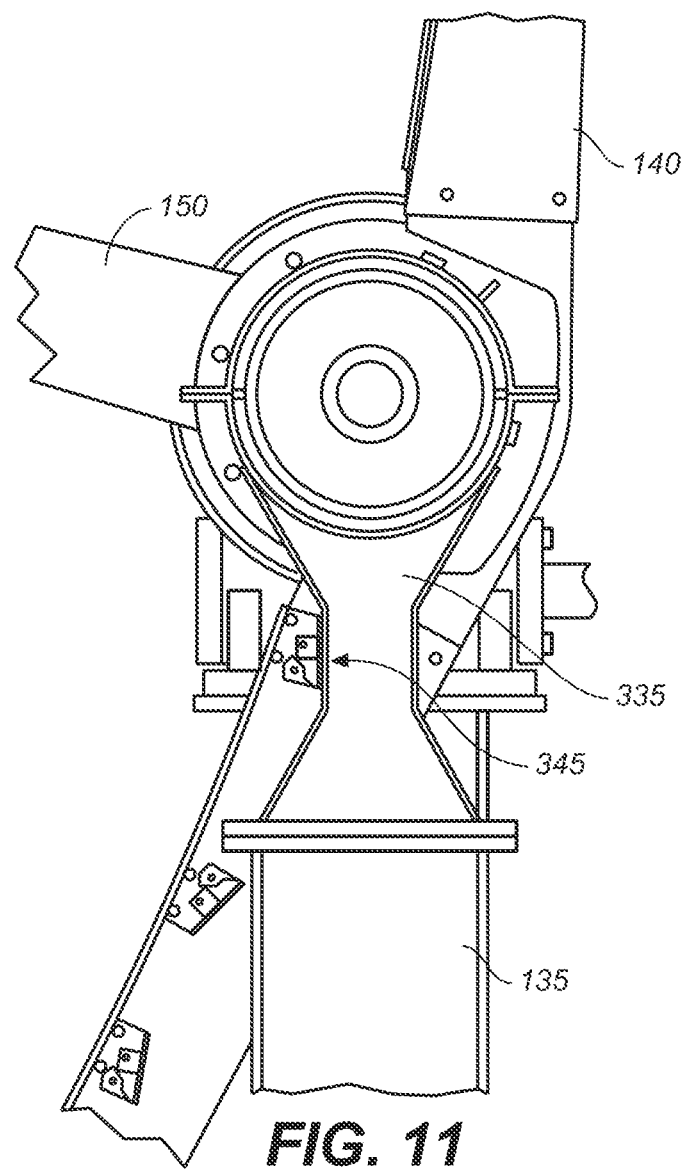

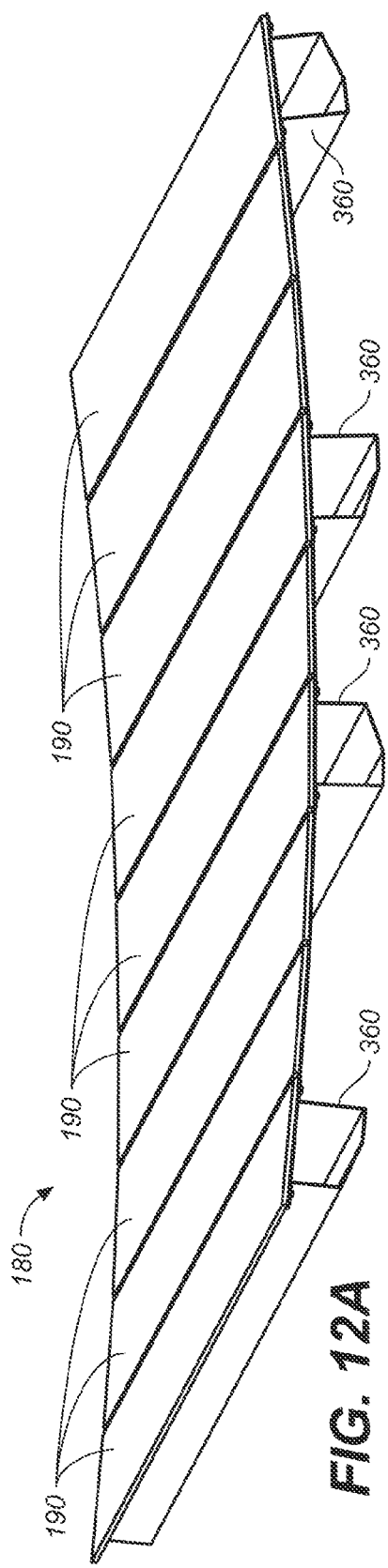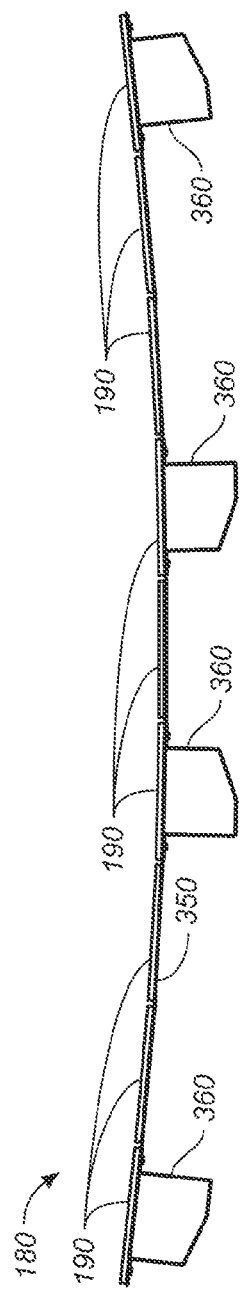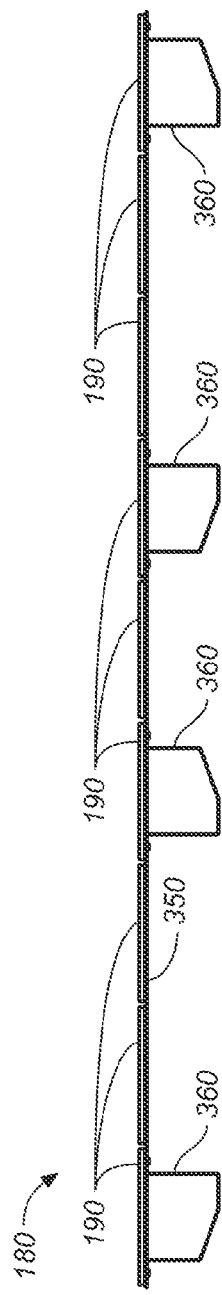
FIG. 12A
FIG. 12B
FIG. 12C

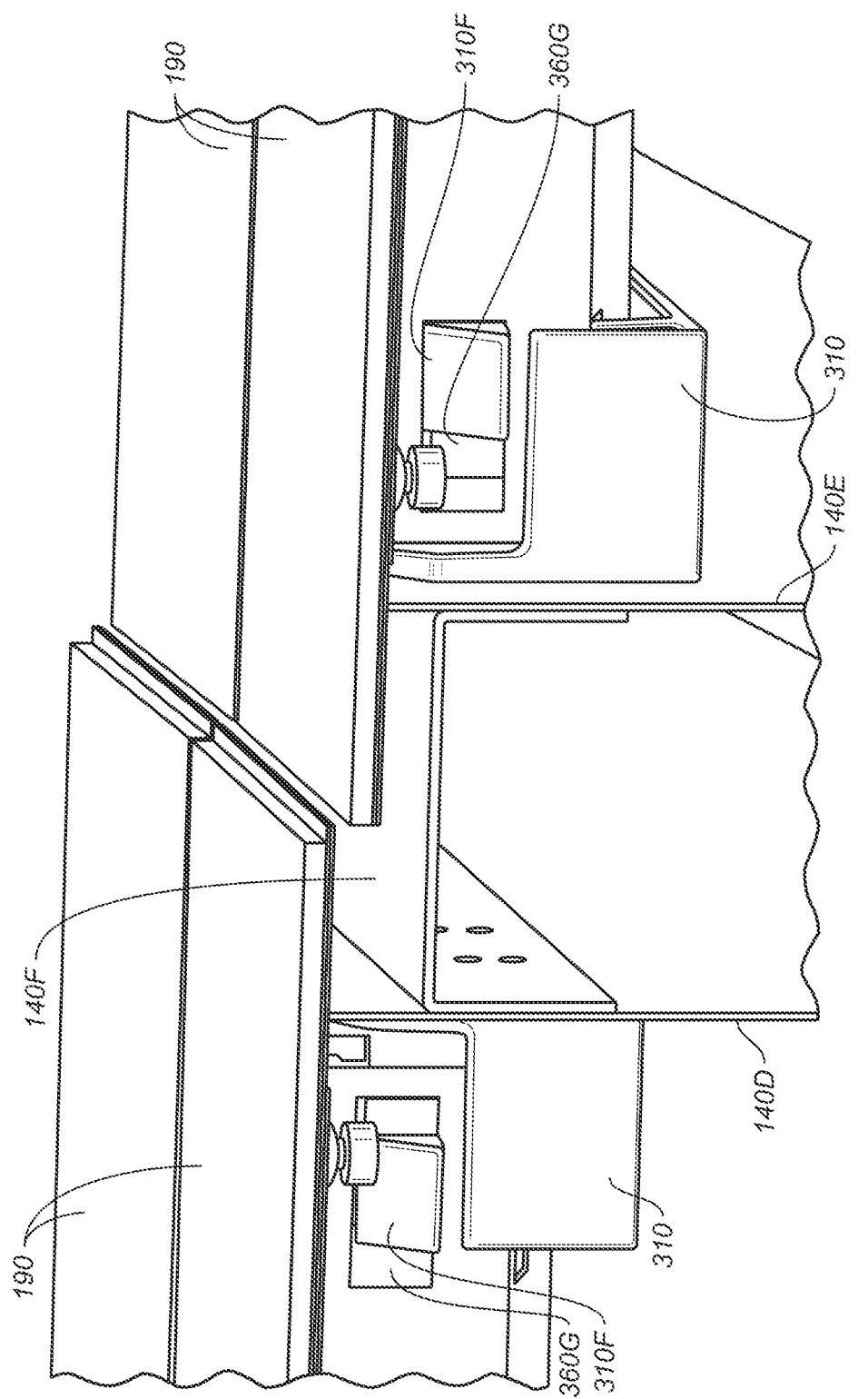

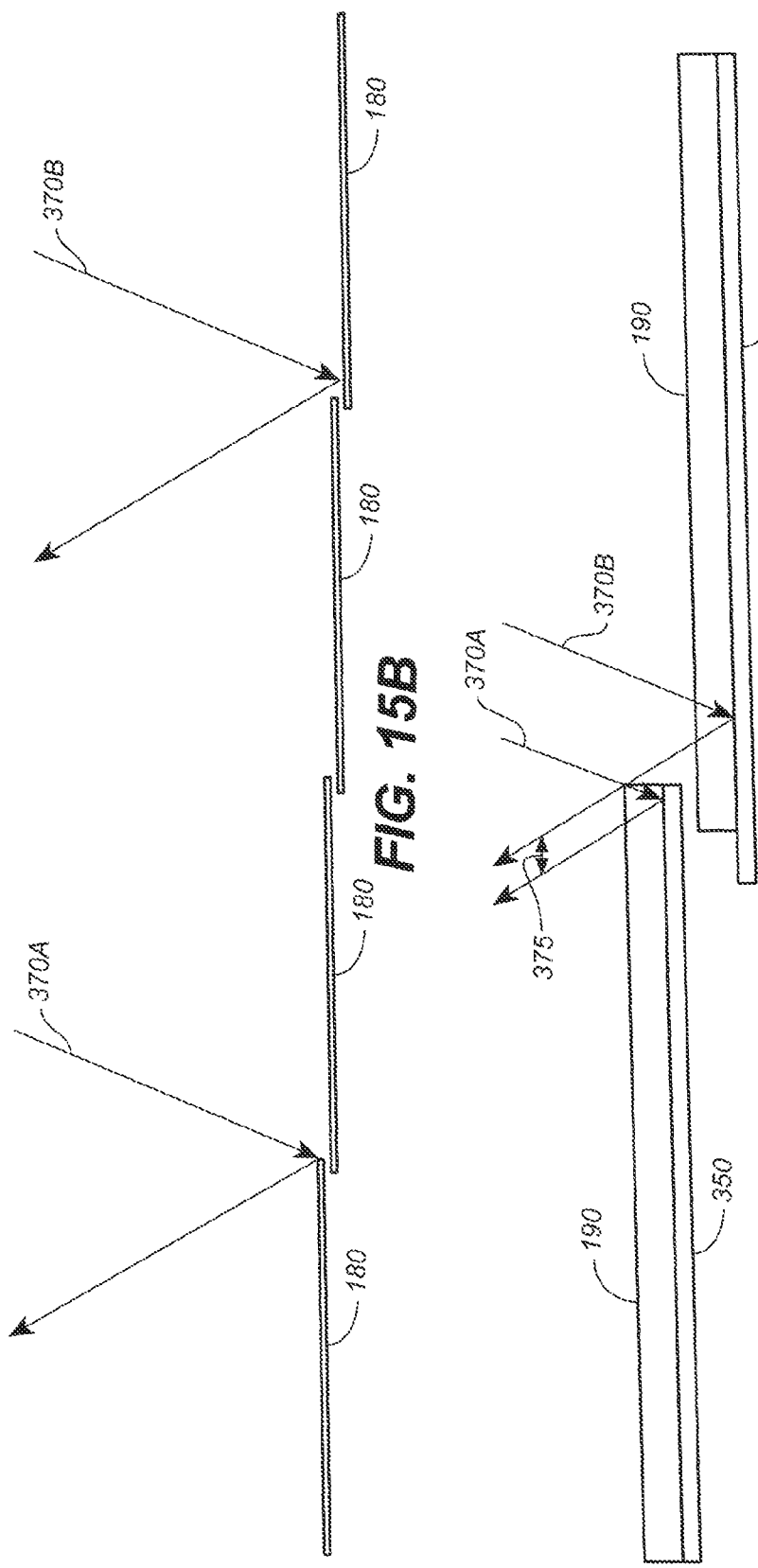

CONCENTRATING SOLAR ENERGY COLLECTOR

FIELD OF THE INVENTION

The invention relates generally to the collection of solar energy to provide electric power, heat, or electric power and heat.

BACKGROUND

Alternate sources of energy are needed to satisfy ever increasing world-wide energy demands. Solar energy resources are sufficient in many geographical regions to satisfy such demands, in part, by provision of electric power and useful heat.

SUMMARY

In one aspect, a solar energy collector comprises a linearly extending receiver comprising solar cells, a linearly extending reflector oriented parallel to a long axis of the receiver and fixed in position with respect to the receiver, and a linearly extending support structure supporting the receiver and the reflector and pivotably mounted to accommodate rotation of the support structure, the reflector, and the receiver about a rotation axis parallel to the long axis of the receiver to concentrate solar radiation onto the solar cells. The support structure comprises a plurality of receiver supports arranged to support the receiver above the reflector. Each of the receiver supports is tilted in a same direction along the rotation axis.

The solar cells may be arranged on a surface of the receiver oriented perpendicularly to the optical axes of the reflector.

The plurality of receiver supports may comprise, for example, a plurality of primary receiver supports and a plurality of secondary receiver supports, with the primary receiver supports in compression and the secondary receiver supports under tension. The secondary receiver supports may be thinner than the primary receiver supports. The primary receiver supports may be arranged, for example, in mirror image pairs along the rotation axis. The secondary receiver supports may be arranged, for example, along the rotation axis in an alternating manner with longitudinally adjacent secondary receiver supports on opposite sides of the rotation axis. The secondary receiver supports may, for example, be more tilted along the rotation axis than are the primary receiver supports.

The solar energy collector may comprise a plurality of transverse reflector supports extending away from the rotation axis to support the reflector, with the lower ends of the primary and secondary receiver supports attached to outer ends of corresponding transverse reflector supports.

The solar energy collector may also comprise an end receiver support at each end of the solar energy collector. The end receiver supports extend parallel to the optical axes of the reflector to support outer ends of the receiver above the reflector.

The solar energy collector may be positioned with its rotation axis oriented in a North-South or approximately North-South direction and the tilted receiver supports tilting away from the equator. This arrangement may advantageously reduce the effect on the solar cells of shadows cast by the primary, secondary, and end receiver supports.

The receiver may comprise a plurality of linearly extending receiver subsections coupled end-to-end, with each receiver subsection comprising one or more fluid channels accommodating flow of a heat transfer fluid through the receiver subsection along its long axis. Fluid interconnections between the receiver subsections may be rigid and in line with the receiver subsections, for example.

The receiver supports may be coupled to the receiver with hinged brackets. This arrangement may accommodate thermally induced changes in length of the receiver and may be particularly advantageous if the receiver and/or interconnections between receiver subsections are rigid. The hinged brackets may, for example, have two pivot axes each of which is oriented perpendicular to the rotation axis.

In variations in which the receiver comprises one or more fluid channels accommodating flow of a heat transfer fluid through the receiver, the solar energy collector may comprise a heat exchanger at least partially shaded by the solar energy collector during operation of the solar energy collector. The heat exchanger may be, for example, a passive heat exchanger attached to and rotating with the support structure. Such a passive heat exchanger may be or comprise, for example, finned tubes shaded by the reflector during operation of the solar energy collector. The receiver may also comprise heat exchanger fins.

The reflector may comprise, for example, a plurality of reflector subsections arranged end-to-end along the rotation axis with ends of adjacent reflector subsections vertically offset with respect to each other to form a repeating pattern of tilted reflector subsections. The offset ends of adjacent reflector subsections may overlap. Such an arrangement may reduce or eliminate shadows cast on the receiver by gaps between the reflector subsections.

The reflector or a reflector subsection may comprise, for example, a plurality of reflector-panel assemblies, with each reflector-panel assembly comprising a plurality of linearly extending reflective elements arranged side-by-side on an upper surface of a flexible panel and oriented parallel to the rotation axis. Each reflector-panel assembly may also comprise a plurality of longitudinal reflector supports arranged under the flexible panel and oriented parallel to the linearly extending reflective elements. The solar energy collector may comprise a plurality of transverse reflector supports extending away from the rotation axis to support the reflector and a plurality of hanger joists attached to each transverse reflector support, with ends of the longitudinal reflector supports attached to and supported by the hanger joists. The longitudinal reflector supports may snap on to the hanger joists, for example, with features on the longitudinal reflector supports interlocking with complementary features on the hanger joists. Attachment of the longitudinal reflector supports to the hanger joists may force ends of the flexible panels against curved edges of the transverse reflector supports to thereby impose a desired reflector curvature on the reflector-panel assemblies. Reflector-panel assemblies may be arranged end-to-end in line along the rotation axis with ends of adjacent reflector-panel assemblies vertically offset with respect to each other to form a repeating pattern of tilted reflector-panel assemblies. The offset ends of adjacent reflector-panel assemblies may overlap.

The solar energy collector may comprise a torque tube defining the rotation axis and a plurality of support posts supporting the torque tube above an underlying surface such as the ground or a roof, for example. The support posts may each comprise a neck region below the rotation axis which provides clearance for a portion of the support structure and thereby extends the angular range over which the support structure may be rotated.

In another aspect, a solar energy collector comprises a linearly extending receiver, a linearly extending reflector oriented parallel to a long axis of the receiver and fixed in position with respect to the receiver, and a linearly extending support structure supporting the receiver and the reflector and pivotably mounted to accommodate rotation of the support structure, the reflector, and the receiver about a rotation axis parallel to the long axis of the receiver. The support structure comprises a plurality of receiver supports and a plurality of hinged receiver brackets, with the hinged receiver brackets coupling the receiver to upper ends of the receiver supports and the receiver supports arranged to support the receiver above the reflector.

The solar energy collector may comprise a plurality of transverse reflector supports extending away from the rotation axis to support the reflector, with the lower ends of some or all of the receiver supports attached to outer ends of corresponding transverse reflector supports.

The receiver may comprise solar cells arranged, for example, on a surface of the receiver oriented perpendicularly to the optical axes of the reflector. In addition, or alternatively, the receiver may comprise one or more channels accommodating flow of a heat transfer fluid through the receiver. The receiver may comprise a plurality of linearly extending receiver subsections coupled end-to-end, with each receiver subsection comprising one or more fluid channels accommodating flow of a heat transfer fluid through the receiver subsection along its long axis. Fluid interconnections between the receiver subsections may be rigid and in line with the receiver subsections, for example. The hinged brackets coupling the receiver to the receiver supports may accommodate thermally induced changes in length of the receiver and may be particularly advantageous if the receiver and/or interconnections between receiver subsections are rigid. The hinged brackets may, for example, have two pivot axes each of which is oriented perpendicular to the rotation axis.

In variations in which the receiver comprises one or more fluid channels accommodating flow of a heat transfer fluid through the receiver, the solar energy collector may comprise a heat exchanger at least partially shaded by the solar energy collector during operation of the solar energy collector. The heat exchanger may be, for example, a passive heat exchanger attached to and rotating with the support structure. Such a passive heat exchanger may be or comprise, for example, finned tubes shaded by the reflector during operation of the solar energy collector. The receiver may also comprise heat exchanger fins.

The reflector may comprise, for example, a plurality of reflector subsections arranged end-to-end along the rotation axis with ends of adjacent reflector subsections vertically offset with respect to each other to form a repeating pattern of tilted reflector subsections. The offset ends of adjacent reflector subsections may overlap. Such an arrangement may reduce or eliminate shadows cast on the receiver by gaps between the reflector subsections.

The reflector or a reflector subsection may comprise, for example, a plurality of reflector-panel assemblies, with each reflector-panel assembly comprising a plurality of linearly extending reflective elements arranged side-by-side on an upper surface of a flexible panel and oriented parallel to the rotation axis. Each reflector-panel assembly may also comprise a plurality of longitudinal reflector supports arranged under the flexible panel and oriented parallel to the linearly extending reflective elements. The solar energy collector may comprise a plurality of transverse reflector supports extending away from the rotation axis to support the reflector and a plurality of hanger joists attached to each transverse reflector support, with ends of the longitudinal reflector supports attached to and supported by the hanger joists. The longitudinal reflector supports may snap on to the hanger joists, for example, with features on the longitudinal reflector supports interlocking with complementary features on the hanger joists. Attachment of the longitudinal reflector supports to the hanger joists may force ends of the flexible panels against curved edges of the transverse reflector supports to thereby impose a desired reflector curvature on the reflector-panel assemblies. Reflector-panel assemblies may be arranged end-to-end in line along the rotation axis with ends of adjacent reflector-panel assemblies vertically offset with respect to each other to form a repeating pattern of tilted reflector-panel assemblies. The offset ends of adjacent reflector-panel assemblies may overlap.

The solar energy collector may comprise a torque tube defining the rotation axis and a plurality of support posts supporting the torque tube above an underlying surface such as the ground or a roof, for example. The support posts may each comprise a neck region below the rotation axis which provides clearance for a portion of the support structure and thereby extends the angular range over which the support structure may be rotated.

These and other embodiments, features and advantages of the present invention will become more apparent to those skilled in the art when taken with reference to the following more detailed description of the invention in conjunction with the accompanying drawings that are first briefly described.

BRIEF DESCRIPTION OF THE DRAWINGS

FIGS. 5A and 5B show, respectively, a hinged bracket supporting one end of the receiver in the example solar energy collector, and another hinged bracket supporting the receiver at an intermediate position away from the end of the receiver.

FIGS. 7A and 7B show, respectively, a plan view of an example transverse reflector support and a cross-sectional view of an arm of the transverse reflector support.

FIGS. 9A and 9B show perspective views of an example post-mounted slew drive, and FIG. 9C shows a side view of the same slew drive.

FIGS. 10A-10C show three perspective views of an example torque tube support.

FIG. 11 shows a cross-sectional view of an example solar energy collector perpendicular to the rotation axis at a location illustrating the additional rotation clearance provided by the neck of an example bearing saddle.

FIG. 12A shows a perspective view of an example reflector-panel assembly, FIG. 12B shows a cross-sectional view of the example reflector-panel assembly flexed into a curved profile, FIG. 12C shows a cross-sectional view of the example reflector-panel assembly in a relaxed flat profile.

FIG. 15A shows a perspective view of two example reflector-panel assemblies attached to an example transverse reflector support in a vertically offset and overlapping manner, and FIGS. 15B-15C show side views of such vertically offset and overlapping reflector-panel assemblies.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention. This description will clearly enable one skilled in the art to make and use the invention, and describes several embodiments, adaptations, variations, alternatives and uses of the invention, including what is presently believed to be the best mode of carrying out the invention.

As used in this specification and the appended claims, the singular forms "a," "an," and "the" include plural referents unless the context clearly indicates otherwise. Also, the term "parallel" is intended to mean "parallel or substantially parallel" and to encompass minor deviations from parallel geometries rather than to require that any parallel arrangements described herein be exactly parallel. The term "perpendicular" is intended to mean "perpendicular or substantially perpendicular" and to encompass minor deviations from perpendicular geometries rather than to require that any perpendicular arrangement described herein be exactly perpendicular.

This specification discloses apparatus, systems, and methods by which solar energy may be collected to provide electricity, heat, or a combination of electricity and heat.

Figure 1A:
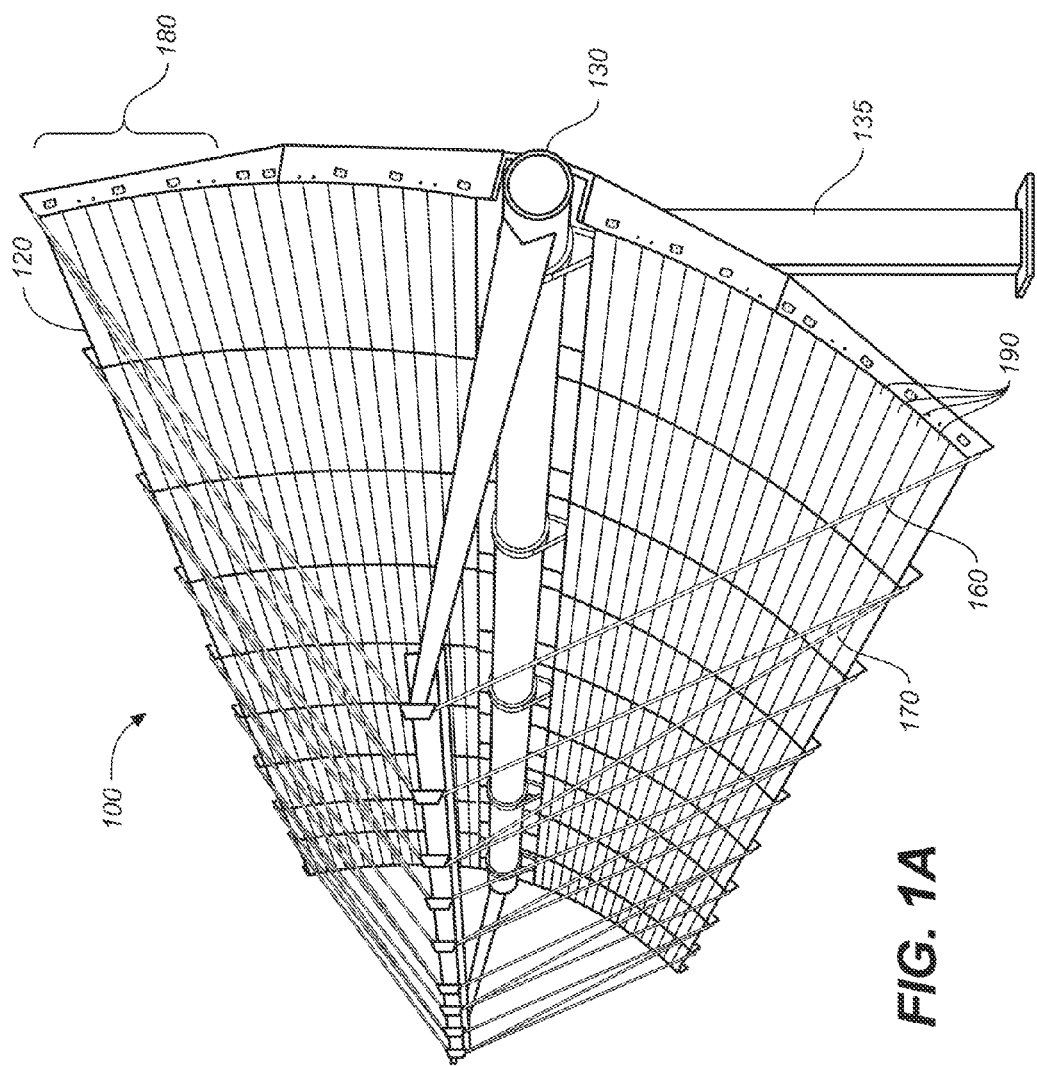
FIGS. 1A-1C show, respectively, front perspective, rear perspective, and end views of an example solar energy collector.
Figure 1B:
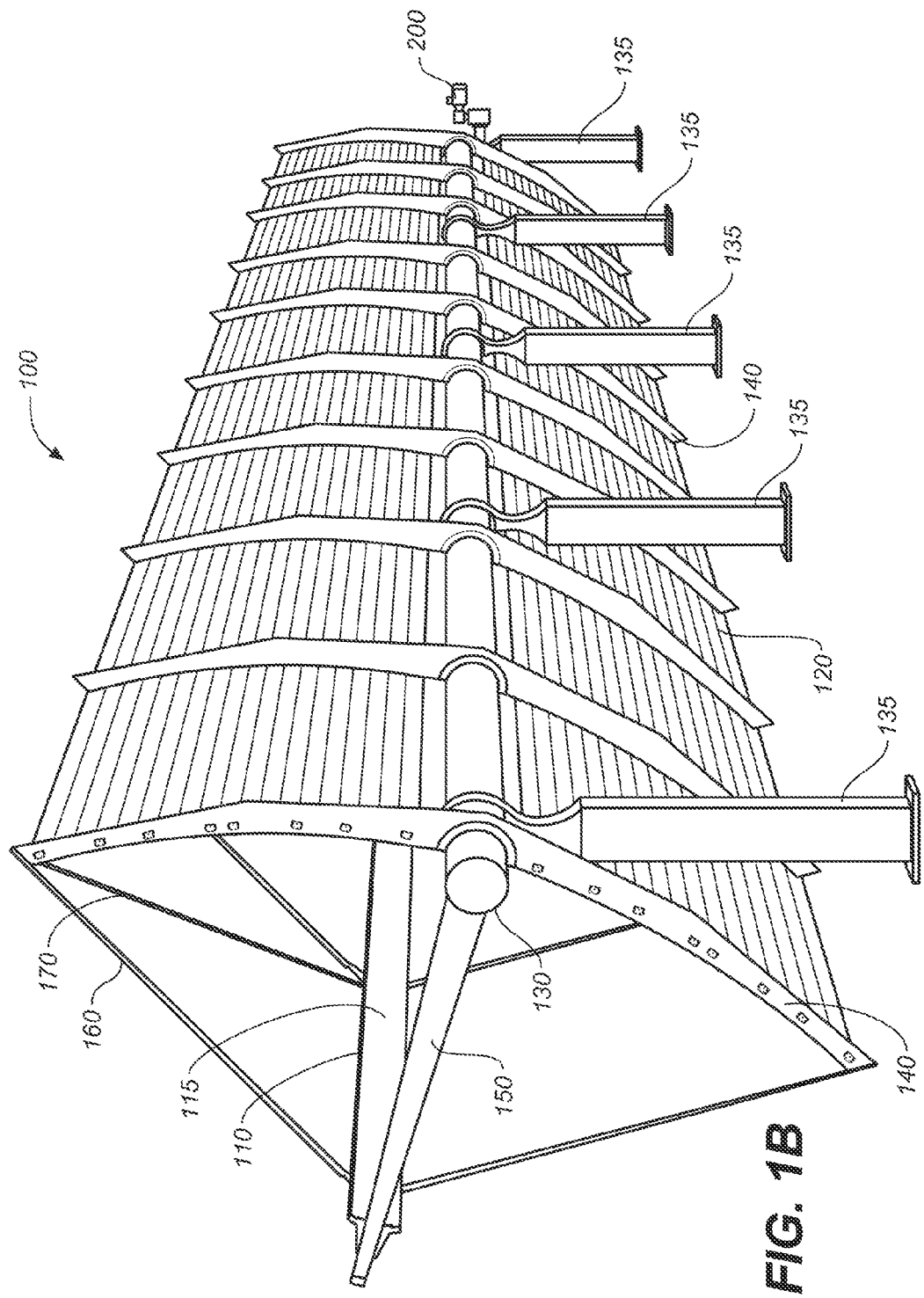
Figure 1C:
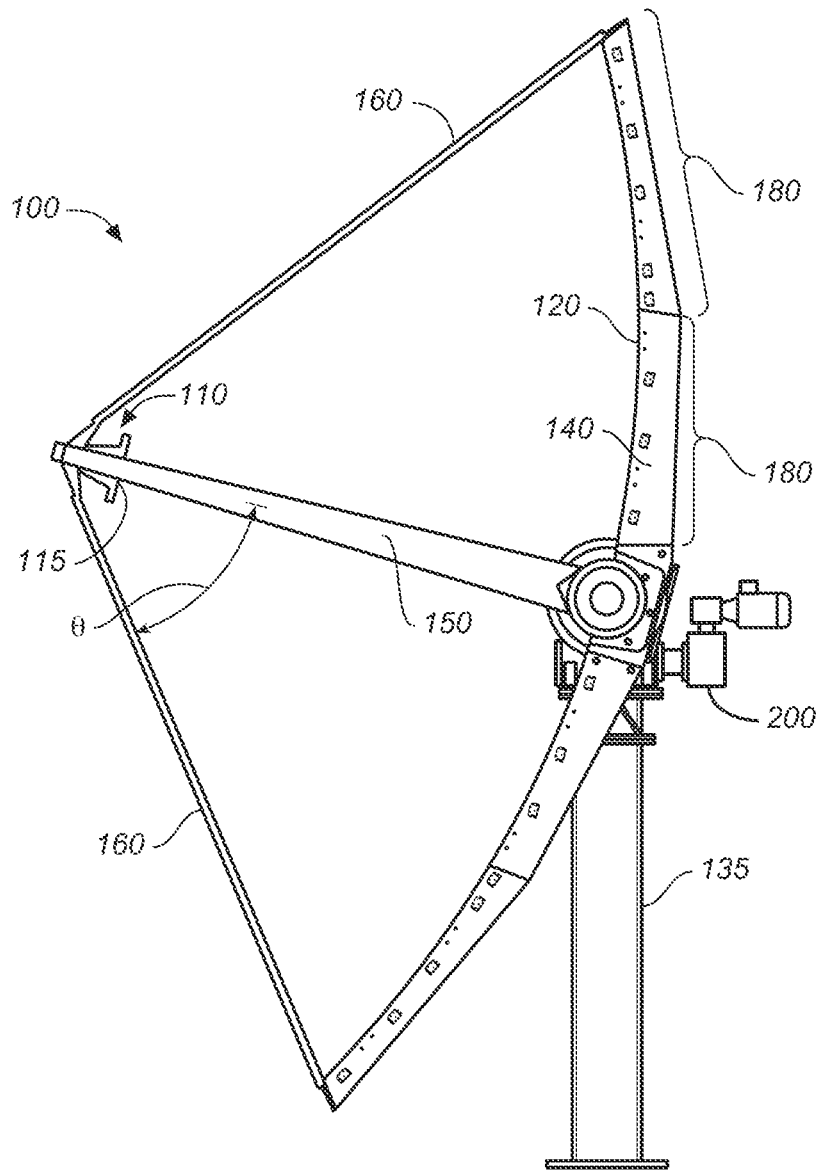

Referring now to FIGS. 1A-1C, an example solar energy collector 100 comprises a linearly extending receiver 110, a linearly extending reflector 120 oriented parallel to the long axis of the receiver and fixed in position with respect to the receiver, and a linearly extending support structure that supports the receiver and the reflector and is pivotably mounted to accommodate rotation of the support structure, the reflector, and the receiver about a rotation axis parallel to the receiver. In the illustrated example, the support structure comprises a torque tube 130 pivotably supported by posts 135, transverse reflector supports 140, and receiver supports 150, 160, and 170, all of which are further described below. The rotation axis of the illustrated support structure is coincident with the central long axis of the torque tube. Other support structure configurations may also be used, as suitable. In operation, the support structure, the reflector, and the receiver are rotated about the rotation axis to track the position of the sun so that solar radiation incident on reflector 120 is concentrated to a linear focus on receiver 110.

In the illustrated example, solar energy collector 100 comprises nine substantially identical reflector/receiver modules which each comprise a receiver subsection and a reflector subsection. The modules are arranged in line with each module positioned between and partially supported by a pair of transverse reflector supports, with the receiver subsections interconnected to form receiver 110, and with the reflector subsections interconnected to form reflector 120. Interconnection of receiver and reflector subsections is further described below. Although collector 100 is shown comprising nine reflector/receiver modules, any suitable number of such modules may be used. If the receivers comprise solar cells, the number of modules used may be selected based on a desired operating voltage, for example. In the illustrated example, the solar cells in nine modules interconnected in series provide an operating voltage of approximately 1000 volts.

Each reflector subsection in the illustrated example comprises four reflector-panel assemblies 180 which together span the width of reflector 120. Two of the reflector-panel assemblies are arranged side-by-side on one side of the torque tube, and the other two reflector-panel assemblies are arranged side-by-side on the other side of the torque tube. Each reflector-panel assembly comprises a plurality of linearly extending reflective elements 190 arranged side-by-side and oriented parallel to the long axis of the receiver. Although the illustrated example includes four reflector-panel assemblies per module, a reflector subsection may include any suitable number of reflector-panel assemblies. As further described below, transverse reflector supports 140 may impose a parabolic curve, an approximately parabolic curve, or any other suitable curve on the reflector-panel assemblies in a plane perpendicular to the rotation axis. The linearly extending reflective elements 190 may thereby be oriented to form a linear Fresnel (e.g., parabolic) trough reflector with its linear focus located at or approximate at the downward-facing horizontal surface of receiver 110.

In the illustrated example, linearly extending reflective elements 190 are flat or substantially flat slat-like reflectors having a length of, for example, about 600 millimeters (mm) to about 3700 mm, typically about 2440 mm, and a width of, for example, about 25 mm to about 700 mm, typically about 75 mm. The width of the reflective elements may be selected to match, or to approximately match, the width of the receiver surface on which the collector concentrates solar radiation (e.g., the width of the solar cells). Reflective elements 190 may be or comprise, for example, any suitable front or rear surface mirror. The reflective properties of reflective elements 190 may result, for example, from any suitable metallic or dielectric coating or polished metal surface. Optionally, each reflective element 190 may have a curvature perpendicular to its long axis that further focuses the solar radiation it reflects to the receiver. Although each reflector-panel assembly in the illustrated example comprises nine linearly extending reflective elements 190, any suitable number of reflective elements 190 may be used in a reflector-panel assembly. Example reflector-panel assemblies are described in greater detail below.

Each receiver subsection comprises a lower surface 115 onto which reflector 120 concentrates solar radiation. Lower surface 115 is oriented horizontally over reflector 120, by which is meant that the plane of lower surface 115 is perpendicular to the optical axes of reflector 120. (Any path perpendicular to the linear focus of reflector 120 for which light rays traveling along that path are reflected to the linear focus is an optical axis of reflector 120 and collector 100). Lower surface 115 comprises solar cells (not shown) that generate electricity from the concentrated solar radiation. Concentrated solar radiation absorbed by the receiver that does not generate electricity instead heats the receiver. Receiver 110 and its subsections include one or more coolant channels through which a heat transfer fluid, typically a liquid, may flow to collect a portion of that heat. Any suitable heat transfer fluid may be used for this purpose. Utilizing solar cells in combination with such active cooling/heat collection allows the receiver to produce electricity more efficiently by cooling the solar cells. In addition, the captured heat may be of commercial value.

The receiver subsections in the illustrated example each comprise an extruded metal substrate that includes integrally formed coolant channels and that spans the length of a reflector/receiver module. Solar cells are laminated or otherwise attached to the lower surface of the substrate to form lower surface 115. Although in the illustrated example the receiver comprises both solar cells and coolant channels accommodating flow of heat transfer fluid, other arrangements may also be used. For example, the receiver may include solar cells but lack coolant channels, or may include coolant channels but lack solar cells. More generally, any suitable receiver configuration may be used. Suitable receiver configurations may include those described in this specification as well as those disclosed in U.S. patent application Ser. No. 12/622,416, filed Nov. 19, 2009, titled "Receiver For Concentrating Photovoltaic-Thermal System;" and in U.S. patent application Ser. No. 12/744,436, filed May 5, 2010, also titled "Receiver For Concentrating Photovoltaic-Thermal system;" both of which are incorporated herein by reference in their entirety.

Figure 2A:
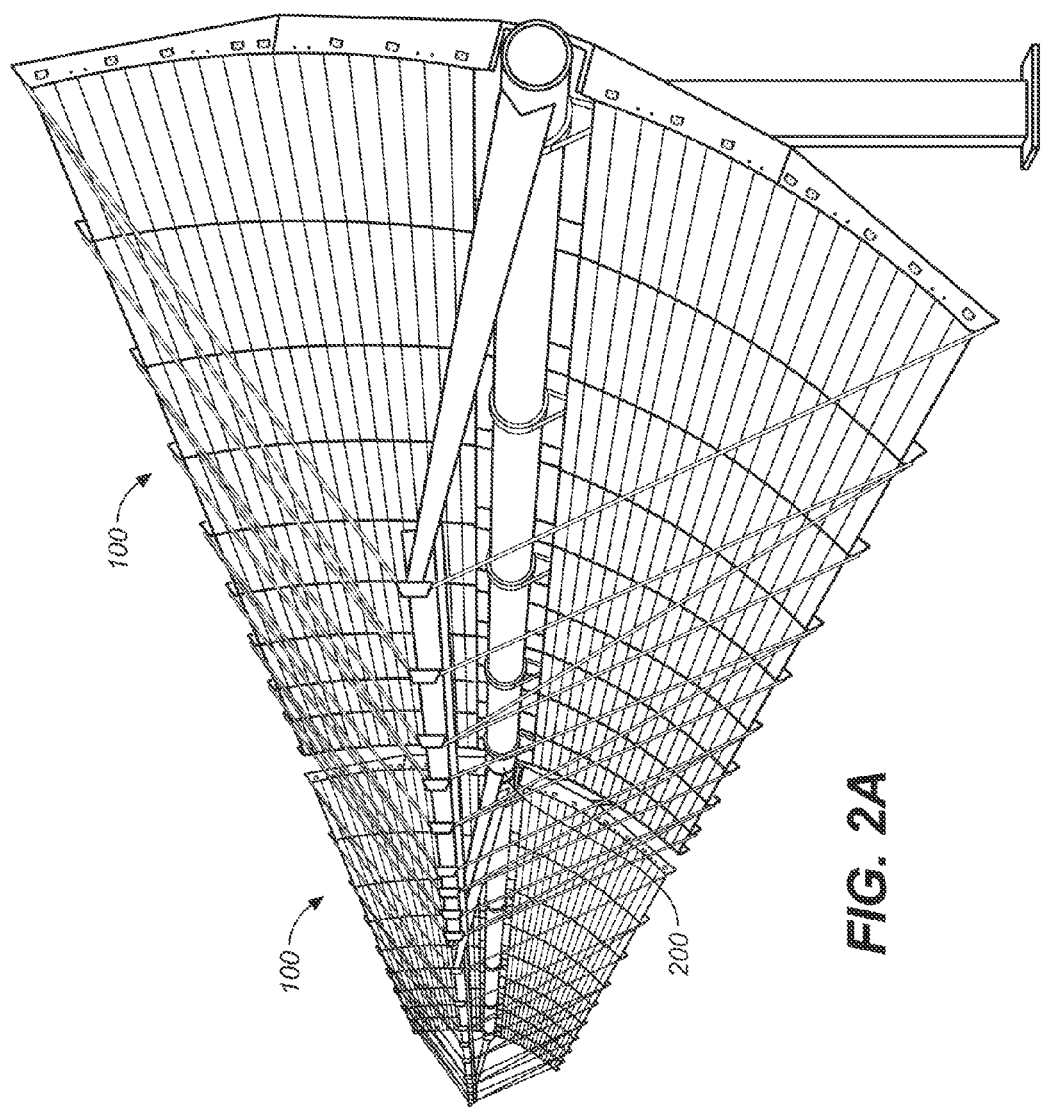
FIGS. 2A and 2B show, respectively, front and rear perspective views of two example solar energy collectors of FIGS. 1A-1C arranged in line and jointly driven by a drive positioned between them.
Figure 2B:
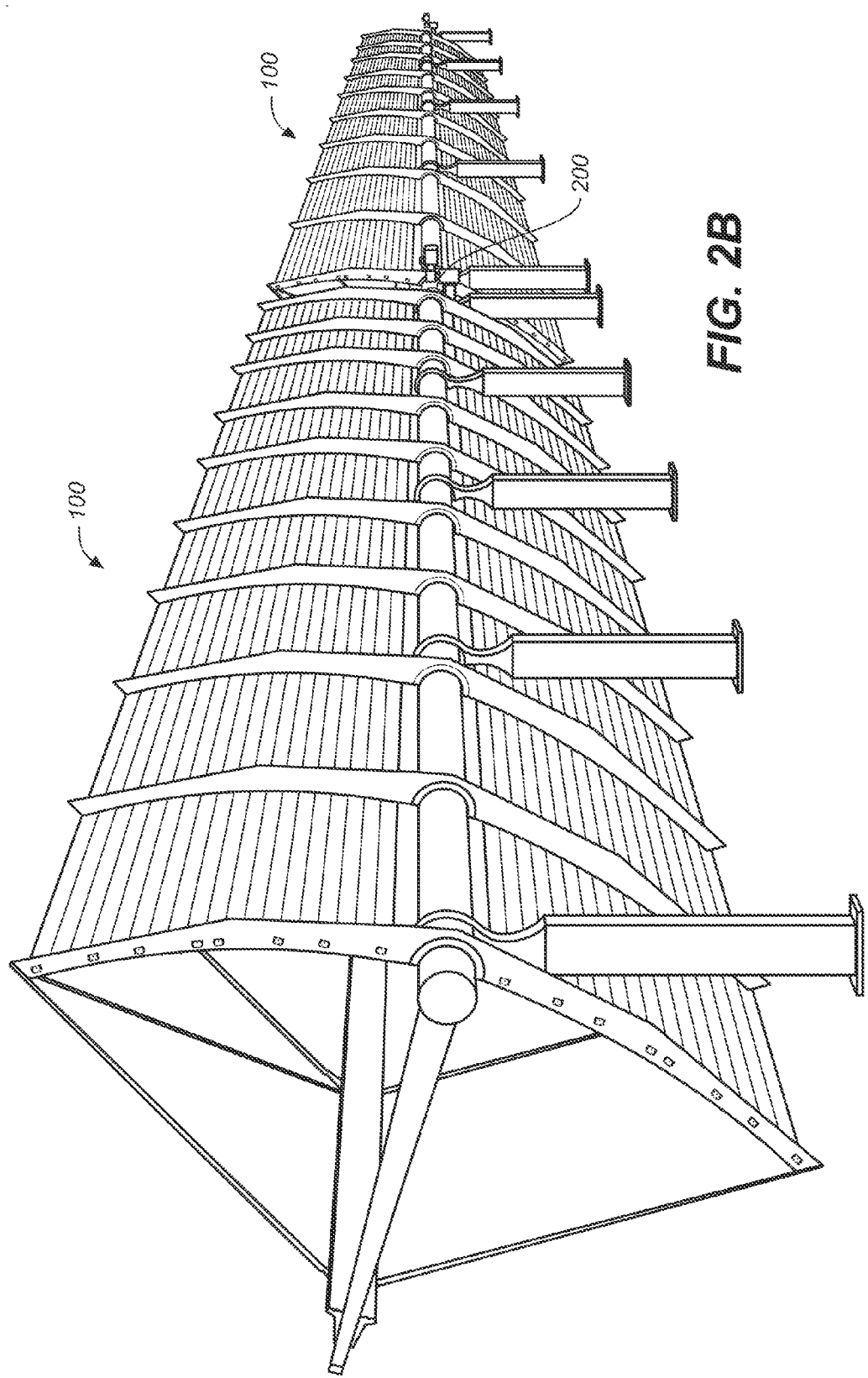

Referring again to FIGS. 1B-1C, the example solar energy collector 100 is rotationally driven by a post-mounted slew drive 200 attached to one end of torque tube 130. Referring now to FIGS. 2A-2B, two solar energy collectors 100 may be arranged in line along a shared rotation axis and rotationally driven by a shared slew drive 200 positioned between the collectors 100. As further described below, the torque tubes 130 of the two collectors may be attached, for example, to opposing faces of a motor-driven slew gear. Any other suitable drive arrangements may also be used. A solar energy collecting system may comprise, for example, a single solar energy collector 100, two or more individual (uncoupled) solar energy collectors 100, a single pair of jointly driven solar energy collectors 100, two or more pairs of such jointly driven solar energy collectors, or any suitable combination of individual solar energy collectors and jointly driven pairs of solar energy collectors.

Referring again to FIGS. 1A-1C, with lower surface 115 of receiver 110 oriented horizontally as illustrated, reflector 120 may have a flatter (more shallow) shape than would typically be required if the receiver were not oriented horizontally but were instead oriented at an angle with respect to the optical axes of reflector 120. As a consequence of this flatter shape, the reflector requires less reflective surface than would be required by a deeper reflector shape to collect the same amount of solar radiation. Also as a consequence of the flatter shape of the reflector, torque tube 130 and the rotation axis it defines may be positioned lower in the reflector, and posts 135 supporting torque tube 130 may be positioned primarily or entirely behind/beneath reflector 120. This allows posts 135 to be positioned wherever needed along torque tube 130, unrestricted by the design of reflector 120 except for the locations at which transverse supports 140 are attached to the torque tube.

As described above, the example solar energy collector illustrated in the figures is modular. Such modularity may facilitate fabrication and installation of the solar energy collector and may allow for simple modification of its length, but is not required. Further, reflector 120 need not have a parabolic or approximately parabolic curvature. Any other curvature suitable for concentrating solar radiation onto the receiver may be used. Also, reflector 120 need not comprise linearly extending reflective elements 190 as illustrated. Instead, reflector 120 or a modular subsection of reflector 120 may be formed from a single continuous reflective element, from two reflective elements (e.g., one on each side of the reflector symmetry plane), or in any other suitable manner. Torque tube 130 may be replaced by a space frame, a truss, or any other suitable structure.

Generally, the electric power provided by a string of series connected solar cells is determined by the lowest performing solar cell in the string. Consequently, a shadow cast on even a single solar cell in a string may significantly degrade the performance of the entire string. The darker the shadow is, the greater the decline in performance of the shaded solar cell and therefore of the string. Such performance-degrading shadows may be cast, for example, by structure in a solar energy collect that supports a receiver over a reflector, when that support structure casts shadows onto the reflector that are projected (e.g., imaged) by the reflector onto the receiver.

Figure 3A:
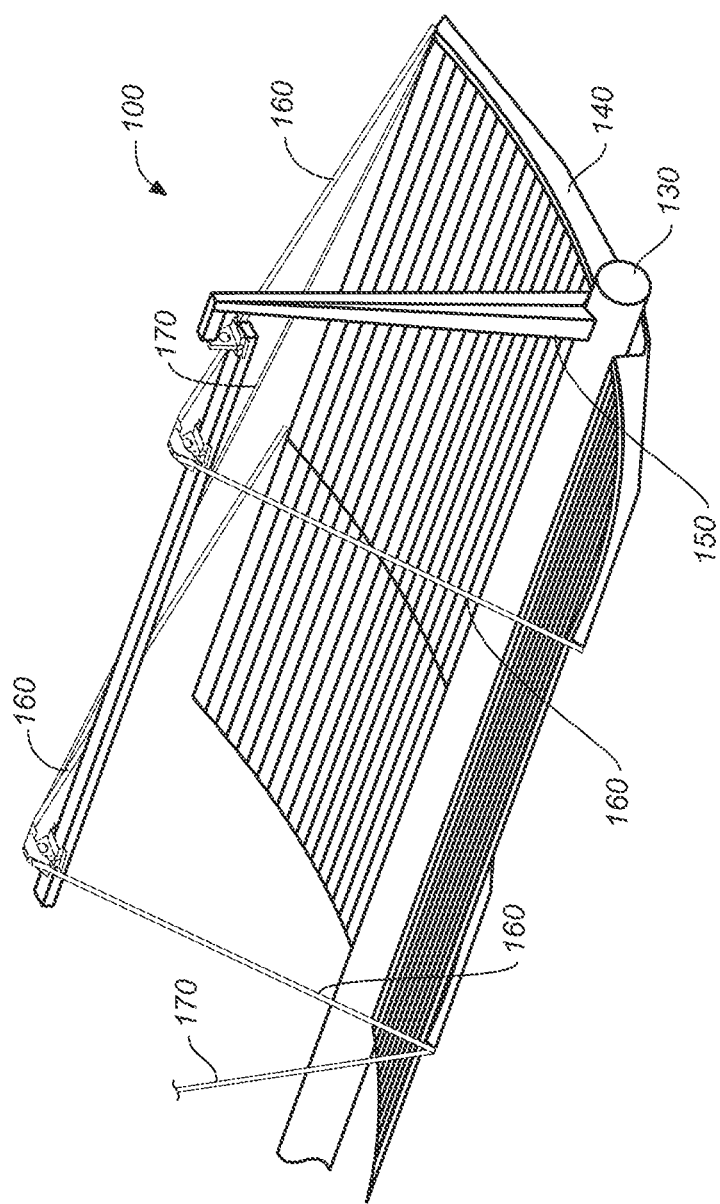
FIGS. 3A and 3B show, respectively, plan and perspective views of the example solar energy collector of FIGS. 1A-1C which more clearly show the arrangement of the receiver supports.
Figure 3B:
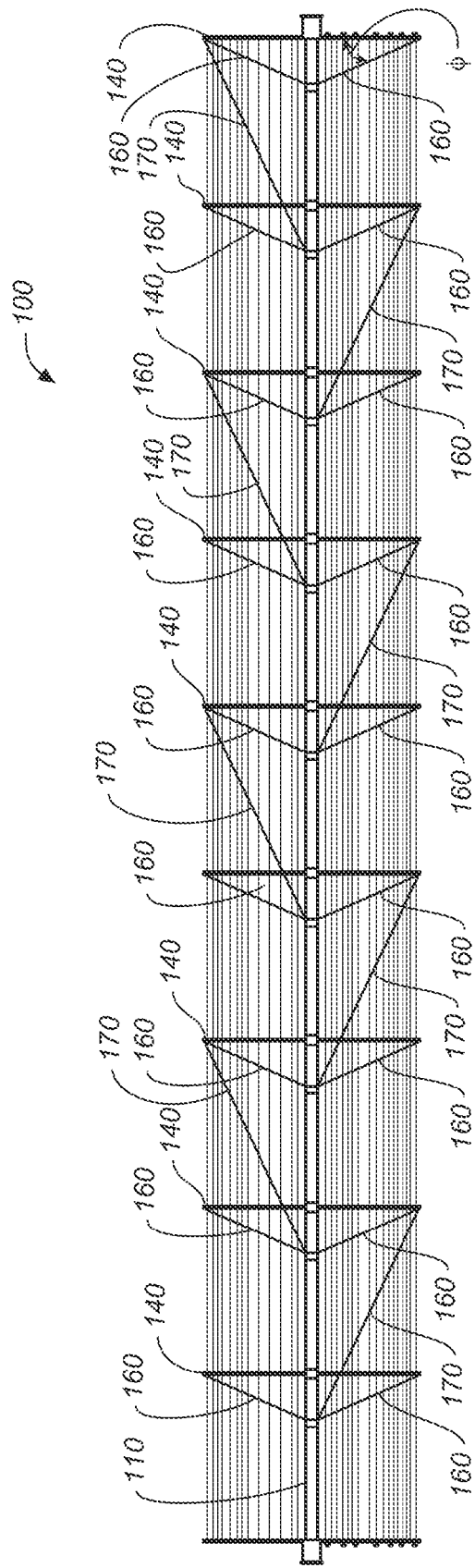

Referring now to FIGS. 3A and 3B, in the example solar energy collector receiver 110 is supported by receiver supports 150, 160, and 170 which are arranged to reduce the effect of their shadows on the performance of the solar energy collector. A single receiver support 150 is located at each end of collector 100. The lower ends of receiver supports 150 are mounted on torque tube 130, and the upper ends of receiver supports 150 are attached by hinged receiver brackets (described in more detail below) to opposite ends of receiver 110. Receiver supports 150 are vertically oriented, by which is meant that they are oriented parallel to the optical axes of reflector 120. Also, receiver supports 150 have the form of tapered beams that are everywhere narrower than torque tube 130. Consequently, if the rotation axis of solar energy collector 100 is oriented in a North-South direction, than in operation of the collector any shadows cast by receiver supports 150 will not fall on reflector 120 but will instead be cast along the length of torque tube 130 or beyond an end of reflector 120.

Primary receiver supports 160 are straight narrow struts or beams located at positions intermediate between the ends of solar energy collector 100. In the illustrated example, primary supports 160 are arranged in mirror-image pairs, with the individual supports of a pair of supports 160 located at the same longitudinal position along the solar energy collector but on opposite sides of receiver 110. Alternatively, supports 160 may be arranged with alternating supports 160 located on opposite sides of receiver 110 and spaced apart along the collector, similarly to secondary supports 170 described below. Any other suitable locations for primary supports 160 may also be used.

Each of primary supports 160 is attached at its lower end to an outer end of a transverse support 140 and attached at its upper end to receiver 110 via a hinged receiver bracket. As is visible in the perspective view of FIG. 3A and in the plan view of FIG. 3B, all of the primary receiver supports 160 are tilted in the same direction parallel to the rotation axis of the collector. In particular, the orientation of each receiver support 160 can be specified by a polar angle $\theta$ (theta) as shown in FIG. 1C and an azimuth angle $\phi$ (phi) as shown in the plan view of FIG. 3B. Polar angle $\theta$ is the angle between support 160 and an optical axis of reflector 120. Azimuth angle φ is the angle between the orthogonal projection of the support 160 onto a reference plane perpendicular to the optical axes of the reflector and a line in that reference plane perpendicular to the rotation axis. Receiver supports 160 tilt along the rotation axis because their azimuth angle φ is not zero.

In operation, solar energy collector 100 may be arranged with its rotation axis in a North-South or approximately North-South orientation with receiver supports 160 tilting away from the equator. Tilting receiver supports 160 along the rotation axis away from the equator spreads the shadow that each support casts along a greater length of the receiver than would be the case if the supports were not tilted. For example, if supports 160 were not tilted along the rotation axis (azimuth angle of zero) and the sun were directly overhead, then during operation of the collector the shadow cast by a support 160 onto reflector 120 would be a line perpendicular to the rotation axis, and reflector 120 would concentrate that shadow onto a single transverse strip of the receiver having about the same width as the support. That is, each linear reflective element 190 shaded by the support 160 would project the shadow of the support 160 onto the same location on the receiver. If instead the sun were directly overhead and supports 160 were tilted away from the equator, then during operation of the collector the shadow cast by a support 160 onto reflector 120 would be a line running diagonal to the rotation axis, and reflector 120 would spread that shadow across a length of the receiver broader than the width of the support. That is, each linear reflective element 190 shaded by the support 160 would project the shadow of the support 160 onto a different location of the receiver, though adjacent such projections might partially overlap. The greater the tilt of supports 160 away from the equator, the more their shadows will be spread out along the receiver. Tilting supports 160 away from the equator has a similar shadow-spreading effect when the sun is not directly overhead.

Spreading out the shadows cast by supports along a greater length of the receiver makes the shadows less dark and thus reduces their impact on the performance of individual solar cells. Rather than degrading the performance of a single solar cell significantly with concentrated shadows, the spread-out shadows degrade the performance of a larger number of solar cells by a lesser amount. Because the lowest performing solar cell may control the performance of an entire string, spreading out the shadows as just described can improve the overall performance of the string by improving the performance of the lowest performing shaded solar cell.

The tilt of receiver supports 160 may be chosen, for example, so that for the intended location (latitude) of the solar energy collector, none of the shadows cast by receiver supports 160 onto receiver 110 at any time of the day or of the year reduces the illumination of any individual solar cell in the receiver by, for example, more than about 3%, more than about 6%, or more than about 15%. In addition, or alternatively, the tilts of the receiver supports may be chosen to minimize the effect of their shadows on the total amount of electric power generated by the collector over the course of some predetermined time period, such as over the course of a year, or over the course of some portion of a year such as, for example, during winter or during summer, or over the course of a day, or over the course of some portion of a day. The various performance criteria just described may be satisfied for locations at latitudes of, for example, ≤about 45 degrees from the equator, ≤about 35 degrees from the equator, or ≤about 20 degrees from the equator.

Supports 160 may be oriented at azimuth angles (defined above) of, for example, ≥about 35 degrees, ≥about 25 degrees, or ≥about 20 degrees. Generally, thinner supports 160 cast thinner shadows and therefore may require less tilt away from the equator (smaller azimuth angle) to achieve the same performance as a collector using thicker but more tilted supports. Supports 160 may have a length of, for example, about 1900 mm to about 2400 mm and a thickness or diameter perpendicular to their long axes of, for example about 15 mm to about 30 mm. Supports 160 may be formed from steel, other metals, or any other suitable material. In the illustrated example, receiver supports 160 are formed from ~2.1 meter lengths of ~24 millimeter outer diameter steel tube.

Figure 5A:
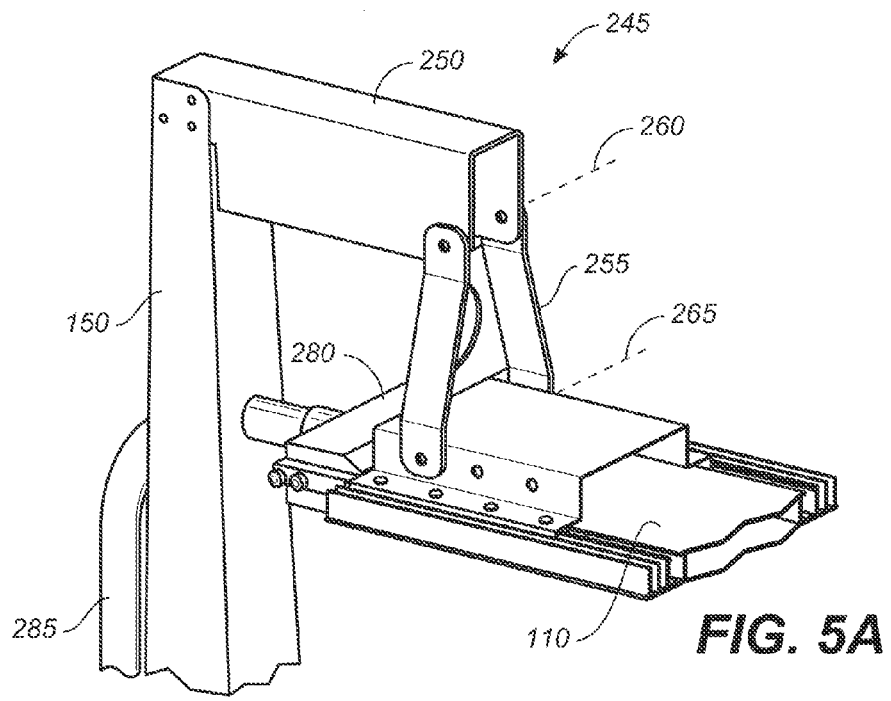

Secondary receiver supports 170 are also straight narrow struts or beams located at positions intermediate between the ends of solar energy collector 100. Each of secondary supports 170 is attached at its lower end to an outer end of a transverse support 140 and attached at its upper end to receiver 110 via a hinged receiver bracket. In the illustrated example, secondary supports 170 are arranged with alternating supports 170 located on opposite sides of receiver 110 and spaced apart along the collector, and there is a single secondary support 170 for each pair of primary supports 160 with the secondary support and the pair of primary supports attached to the same hinged receiver bracket (FIG. 5A). Any other suitable arrangement of secondary supports 170 may also be used. Secondary supports 170 are tilted in the same direction along the rotation axis as the primary supports, but at a greater azimuth angle. Consequently, shadows cast by secondary supports 170 are spread out along the receiver even further than the shadows cast by the primary supports.

Primary supports 160 are in compression. Secondary supports 170 are in tension and can therefore be thinner than the primary supports. Supports 170 may have a length of, for example, about 3100 mm to about 4100 mm and a thickness or diameter perpendicular to their long axes of, for example about 5 mm to about 20 mm. Supports 170 may be formed from steel, other metals, or from any other suitable material. Also, because secondary supports 170 are in tension, they may optionally be guy wires (e.g., tensioned steel cables) rather than rigid struts or beams. In the illustrated example, receiver supports 170 are formed from ~3.7 meter lengths of ~18 millimeter outer diameter steel tube.

In the illustrated example, all receiver supports located at positions between the ends of solar energy collector 100 (i.e., all of primary supports 160 and all of secondary supports 170) are tilted as described above in the same direction along the rotation axis. Although the illustrated example shows all primary supports tilted in the same direction along the rotation axis by the same azimuth angle, the tilts (azimuth angles) may instead be different for different primary supports. Similarly, secondary supports may all be tilted by the same azimuth angle in the direction along the rotation axis, as illustrated, or be tilted by different azimuth angles. Further, some or all receiver supports located at positions between the ends of solar energy collector 100 may be oriented differently than illustrated, e.g., not tilted along the rotation axis or tilted toward the equator. More generally, although the receiver support configurations just described above may be advantageous, any other suitable receiver support configurations may also be used.

Figure 4A:
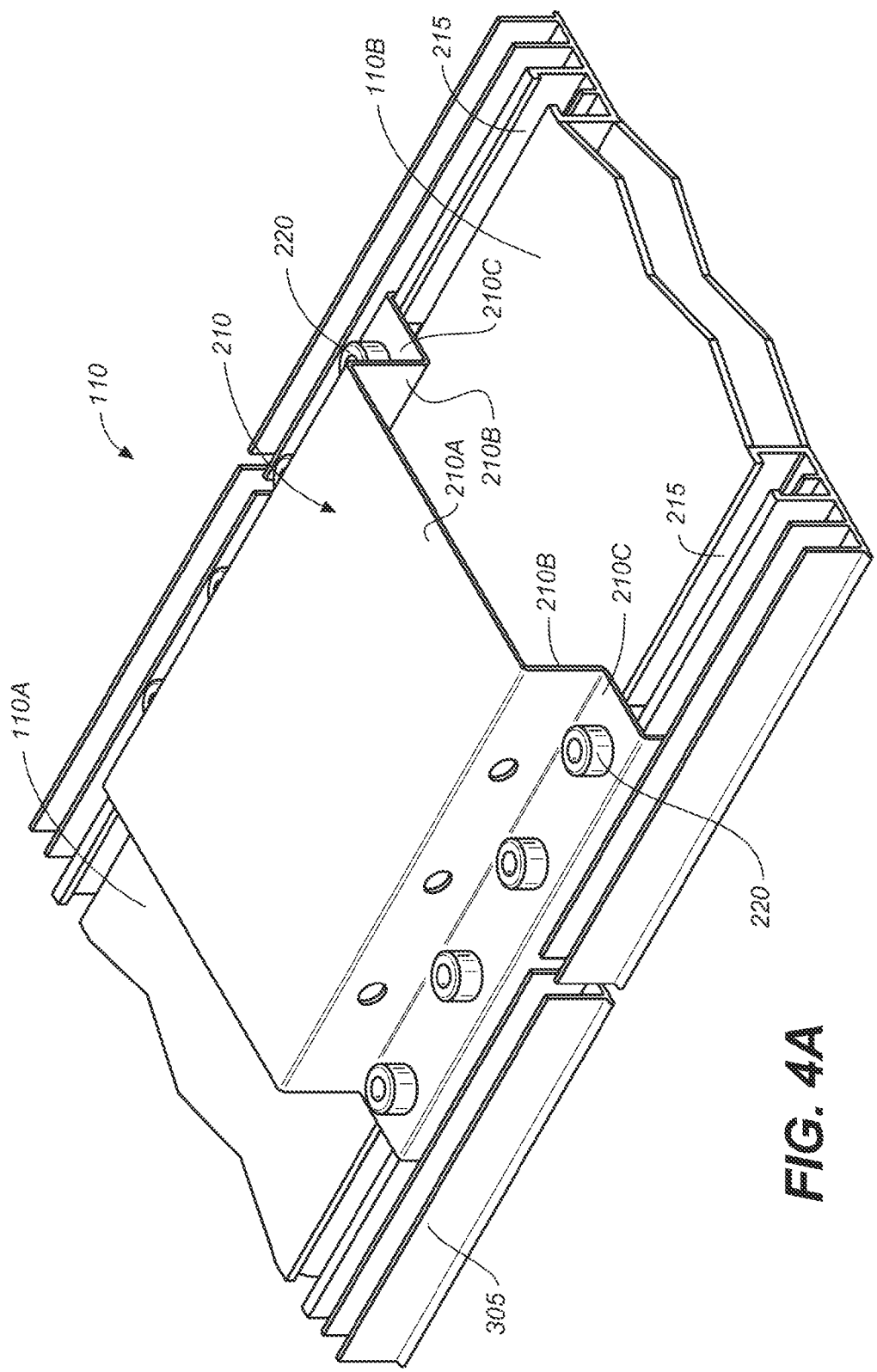
FIGS. 4A, 4B, and 4C show, respectively, a perspective view of two receiver subsections of the example solar energy collector rigidly coupled to each other by a connector, an end view of one of the receiver subsections coupled to the connector, and a plan view of the two receiver subsections coupled to each other by the connector.
Figure 4B:
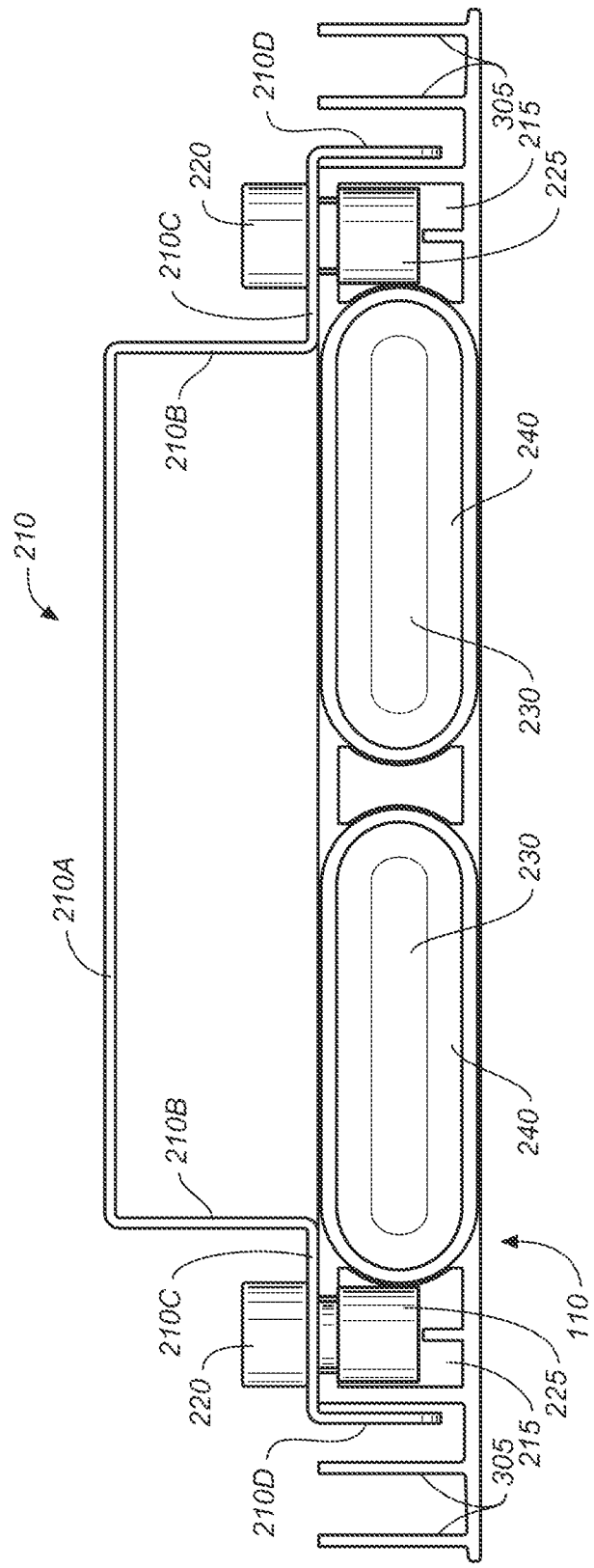
Figure 4C:
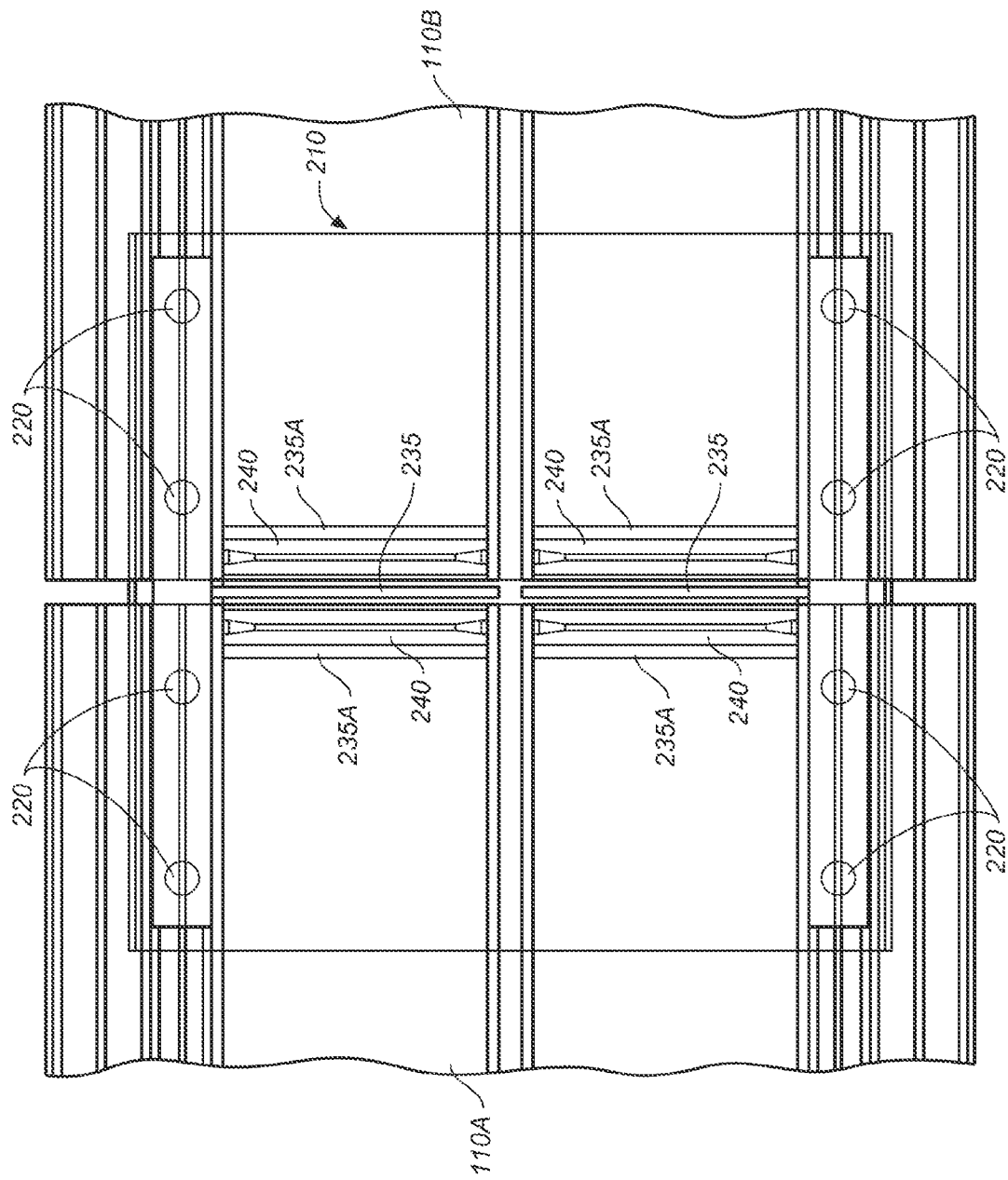

In the illustrated example, the receiver subsections of adjacent modules are rigidly interconnected end-to-end to form receiver 110, and thermal expansion of receiver 110 is accommodated by attaching receiver supports 150, 160, and 170 to receiver 110 with hinged brackets. Referring now to FIGS. 4A-4C, two overlapping receiver subsections 110A and 110B are rigidly connected with example connector 210. Connector 210 comprises a top panel 210A, two side panels 201B bent downward from the top panel by ~90 degrees, two flange panels 210C each bent outward from a side panel by ~90 degrees to an orientation parallel to that of the top panel, and two lower side panels 210D each bent downward from a flange panel by about 90 degrees. In the illustrated example connector 210 is formed from steel sheet, but any other suitable material may also be used.

In the illustrated example, the receiver subsections include slots 215 in their upper surfaces running parallel to the long axis of the receiver. Connector 210 is configured and positioned to extend along the upper side of the receiver, overlapping the ends of two adjacent receiver subsections, with bolt through-holes (not shown) in its flange panels 210C aligned with slots 215 in the receiver subsections and with the connector's lower side panels 210D in contact with or adjacent to outer walls of slots 215. Connector 210 is attached to the receiver subsections by bolts 220 inserted in the through-holes in flange panels 210C to engage nuts 225, which are retained in slots 215 of the receiver subsections by upper lips on the slots. Any other suitable fasteners or fastening method may be used instead, however. Connector 210 rigidly maintains the adjacent receiver subsections end-to-end with respect to each other. Further, the multiple 90 degree bends in connector 210 make the joint between the receiver subsections rigidly resistant to bending. Although use of example connector 210 may be advantageous, any other connector suitable for rigidly interconnecting receiver subsections may also be used.

Electrical interconnections between receiver subsections may be made in any suitable manner. Fluid interconnections between adjacent receiver subsections may be made, for example, with connectors arranged in line with openings in the ends of the receiver subsections that communicate with the coolant channels in the receiver subsections. Referring now to the end view of FIG. 4B, in the illustrated example the receiver subsections each include two parallel coolant channels that run the length of the subsections, and the end faces of the receiver subsections include two openings 230 that each communicate with one of the coolant channels. Referring now to the plan view of FIG. 4C, corresponding coolant channels in the adjacent receiver subsections are interconnected with fluid connectors 235. Fluid connectors 235 are symmetrical with two ends 235A each configured to mate with an opening in the end of a receiver subsection. With the connectors installed, coolant may flow from a coolant channel in one receiver subsection through a fluid connector 235 into the corresponding coolant channel in the other receiver subsection. Seals between fluid connectors 235 and openings 230 in the ends of the receiver subsections may be facilitated, for example, with conventional flexible sealing material. In the illustrated example, openings 230 comprises a sealing material 240 disposed around its perimeter, but such sealing material may instead or additionally be disposed on connectors 235.

Using such in-line fluid interconnections may advantageously reduce the pressure drop between receiver subsections and reduce cost compared to alternative fluid interconnection schemes. Any other suitable means of fluidly interconnecting the receiver subsections may also be used, however.

Thermal expansion of the receiver during operation of the solar energy collector is not significantly accommodated by the interconnection between receiver subsections if those interconnections are rigid. In the illustrated example, thermal expansion is instead accommodated by hinged connections between the receiver and the receiver supports. These hinged connections can pivot outward or inward in the direction of the receiver's long axis to accommodate increases or decreases in the receiver's length. This pivoting action is accompanied by an insignificant change in the height of the receiver, which does not affect performance of the solar energy collector.

Referring now to FIGS. 5A and 5B, receiver supports 150 located at the ends of the receiver are attached to the receiver by hinged brackets 245, which each comprise an arm 250 that is attached to the top of receiver support 150 and projects over receiver 110 and a hinge 255 that is pivotably suspended from arm 250 and pivotably attached to a connector 210 on the upper surface of the receiver. (In this instance, the connector 210 is not located to interconnect two receiver subsections). Hinge 255 may swing about a first pivot axis 260 at its upper end and about a second pivot axis 265 at its lower end, both oriented perpendicularly to the long axis of the receiver, to accommodate changes in the receiver length. Similarly, primary receiver supports 160 and secondary receiver supports 170 are attached to the receiver by hinged brackets 270, which each comprise an upper cap portion 275, to which the receiver supports attach, and a hinge 255 that is pivotably suspended from cap 275 and pivotably attached to a connector 210 on the upper surface of the receiver. Hinge 255 may swing about a first pivot axis 260 at its upper end and about a second pivot axis 265 at its lower end, both oriented perpendicularly to the long axis of the receiver, to accommodate changes in the receiver length. In the illustrated example hinges 255, arms 250, and cap portions 275 are formed from steel sheet, but any other suitable material may also be used.

Although in the illustrated example the receiver subsections are rigidly interconnected, that may be advantageous but is not required. Flexible interconnections may be used, instead. Alternatively, interconnections between some pairs of receive subsections may be rigid while interconnections between other pairs of receiver subsections are flexible. The use of hinged connections between the receiver and the receiver supports to accommodate thermal expansion of a rigid receiver may also be advantageous, but is not required.

Heat transfer fluid may be circulated through receiver 110 with a pump (not shown). The pump may optionally be mounted on the rotating support structure (e.g., on the torque tube) so that it is fixed in position with respect to the receiver, which may facilitate fluid interconnections between the pump and the receiver. This is not required, however. The pump may be located in any other suitable location, instead. The heat transfer fluid circuit may comprise an expansion tank (not shown) to accommodate changes in the volume of heat transfer fluid in the circuit that result from changes in the temperature of the heat transfer fluid. The expansion tank may be mounted on the rotating support structure (e.g., on the torque tube) or in any other suitable location.

The heat transfer fluid circuit may also optionally include passive heat exchangers, active heat exchangers (e.g., fin-fan heat exchangers), or both passive and active heat exchangers that remove heat from the heat transfer fluid before the heat transfer fluid is recirculated through the receiver. These heat exchangers may, for example, be positioned so that they are shaded, or at least partially shaded, by the solar energy collector during operation. The heat exchangers may be mounted, for example, on the rotating support structure, (e.g., on the torque tube, the transverse reflector supports, and/or the receiver supports).

Figure 6:
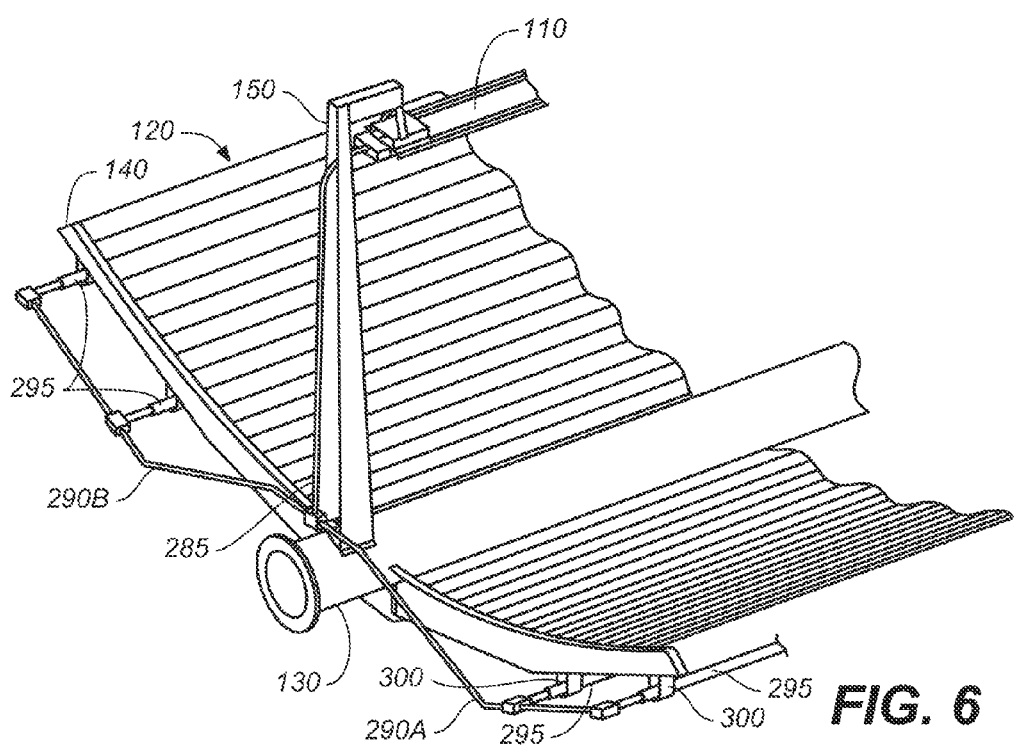
FIG. 6 shows a perspective view of the end of an example solar energy collector in which can be seen passive heat exchangers mounted under the reflector.

Referring now to FIG. 5A and to FIG. 6, in the illustrated example heat transfer fluid that has been heated in receiver 110 exits the receiver through fluid manifold 280 to conduit 285, passes through conduit 285 to headers 290A and 290B, and then flows from the headers through passive heat exchangers 295 to a pump located at the other end of the solar energy collector. The pump then recirculates the heat transfer fluid through the receiver. Heat exchangers 295 are attached to the undersides of transverse reflector supports 140 by hangers 300. In this location, heat exchangers 295 are shaded by reflector 120 during operation of the solar energy collector.

In the illustrated example, heat exchangers 295 are formed from finned aluminum tube through which the heat transfer fluid passes. The finned aluminum tube may have an inner diameter of, for example, about 10 mm to about 35 mm, typically about 18 mm. The fins may have a height of, for example, about 8 mm to about 40 mm, typically about 15 mm. The finned tubes may have, for example, about 3 to about 8 fins per inch, typically about 5. Suitable finned aluminum tube may be available, for example, from Ningbo Winroad Refrigeration Equipment Co. Ltd of Ningbo, Zhejiang, China. Such finned tube heat exchangers may be positioned in any other suitable location in addition to or instead of as illustrated.

Referring again to FIGS. 4A-4B, in the illustrated example the receiver comprises optional heat exchange fins 305 that run parallel to the long axis of the receiver. Fins 305 facilitate passive cooling of the heat transfer fluid before it exits the receiver.

Heat exchangers employed to cool the heat transfer fluid may exhaust the collected heat to the local environment, as is the case for finned tube heat exchangers 295 and for fins 305 on receiver 110 described above. The heat collected by the heat transfer fluid may have commercial value, however. Optionally, heat extracted from the heat transfer fluid may be provided for use by a thermal application such as, for example, electric power generation, operation of a thermally driven chiller, or heating.

As noted above in the description of FIGS. 1A-1C, reflector 120 is supported by transverse reflector supports 140. Referring now to FIGS. 7A-7B, in the illustrated example solar energy collector the transverse reflector supports 140 each comprise a pivot joint 140A and two arms 140B, one on each side of the pivot joint. Pivot joint 140A has an approximately hemispherical upper edge that is curved to conform to the cylindrical surface of the torque tube. As shown in FIG. 7B, each arm 140B has a bottom panel 140C and two side walls 140D and 140E that form an approximately U-shaped cross section, with side walls 140D and 140E of different heights. Cross-piece 140F braces side walls 140D and 140E. Referring again to FIG. 7A, the upper edges of side walls 140D and 140E have a parabolic or approximately parabolic curvature. In the assembled solar energy collector, these upper edges impose their curvature on the portions of reflector 120 that they support. Pivot joint 140A and arms 140B may be formed from steel sheet, for example. Any other suitable material may be used instead, however. Arms 140B may be attached to pivot joint 140A with bolts or with any other suitable fasteners or fastening method.

FIG. 7A also shows approximately U-shaped joist hangers 310 attached to transverse support 140. Joist hangers 310, further described below, are used to attach longitudinal reflector supports to the transverse reflector supports. The longitudinal reflector supports are also described below.

Figure 8:
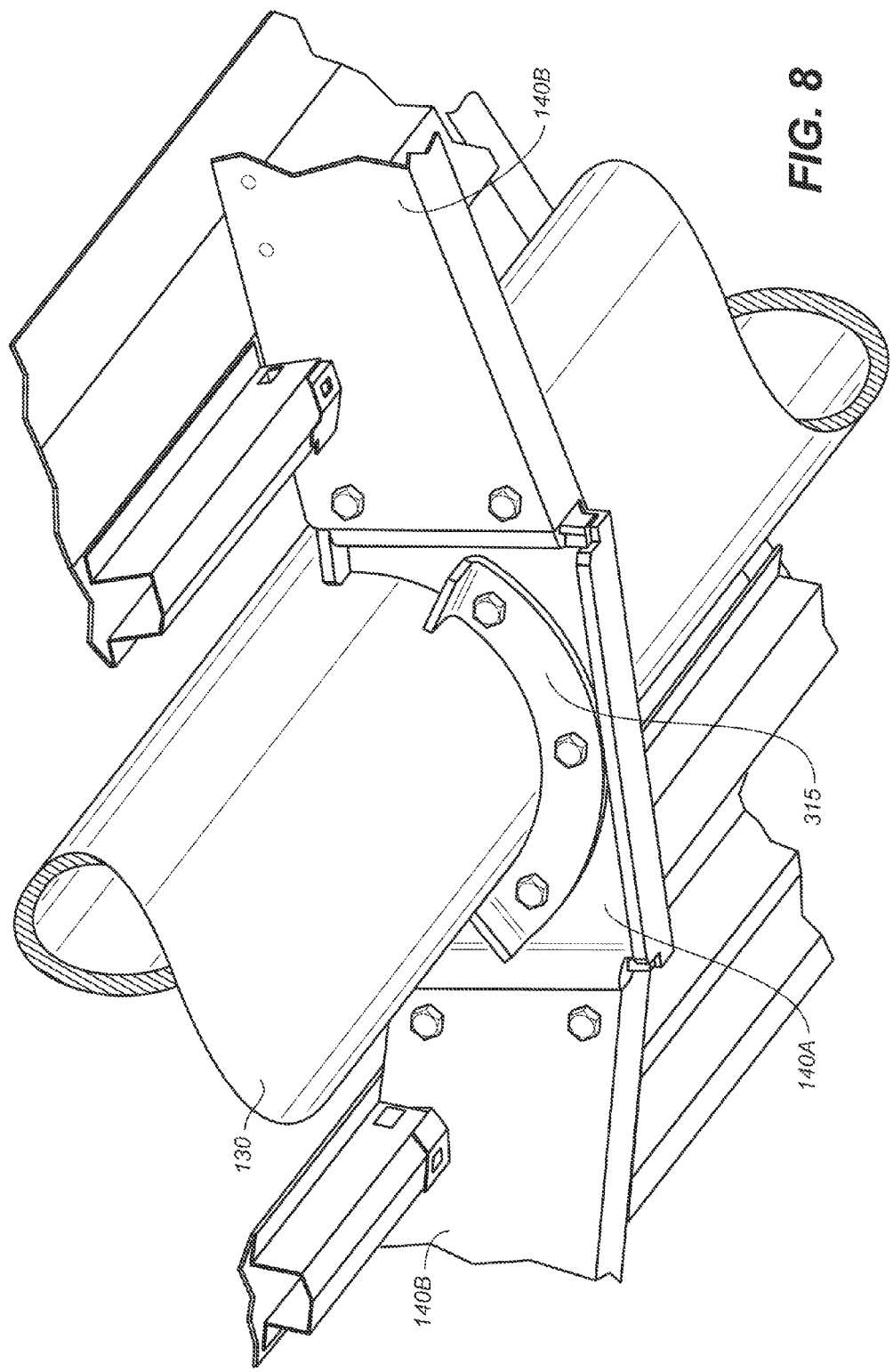
FIG. 8 shows a perspective view of the underside of an example solar energy collector illustrating the attachment of the transverse reflector support of FIG. 7 to a torque tube.

Transverse reflector supports 140 may be attached to torque tube 130 as shown in FIG. 8. A crescent shaped bracket 315 having a curved upper edge that is shaped to conform to the cylindrical surface of the torque tube is welded to the torque tube surface along that edge. Bolts or other suitable fasteners pass through clear holes (not shown) in crescent bracket 315 and through slots 140G in pivot joint 140A to attach transverse reflector support 140 to torque tube 130.

Slots 140G allow for approximately +/−5 degrees of adjustment to the orientation of transverse reflector support 140, which may be used to accommodate misalignment of crescent bracket 315 on torque tube 130, for example.

Any other suitable configuration for transverse reflector supports 140, and any other suitable methods for attaching transverse reflector supports to the torque tube, may also be used.

Torque tube 130 may be, for example, a steel pipe having an outer diameter of, for example, about 100 mm to about 300 mm, typically about 200 mm, and a length of, for example, about 2.4 meters to about 100 meters, typically about 12 meters. Any other suitable material and dimensions for the torque tube may also be used.

As noted above in the description of FIGS. 1A-C and FIGS. 2A-2B, torque tube 130 is pivotably supported by posts 135 and rotationally driven from one end by a post-mounted slew drive 200. Referring now to FIGS. 9A-9C, slew drive 200 is mounted on a post 317 and comprises a motor 320 that drives a slewing gear 325. A flange 330 is attached to a face of the slewing gear and to the end of the torque tube to couple the torque tube to the slew drive. In variations in which slew drive 200 is positioned between and jointly drives two in-line solar energy collectors (e.g., FIGS. 2A-2C), the torque tubes of the two collectors may be coupled to opposite faces of the slew drive with separate flanges 330. Slew drive 200 may be, for example, a model VE9A slew drive available from Jiangyin Huafang New Energy Hi-Tech Equipment Co., Ltd. (H-Fang) of Jiangyin City, Jiangsu, China. Although the illustrated slew drive arrangement may be advantageous, any other suitable drive arrangement may be used instead.

In addition to being driven and partially supported by post-mounted slew drive 200, torque tube 130 is pivotably supported by post-mounted bearings. Referring now to FIGS. 10A-10C, at each support post 135 the torque tube passes through a bearing (not shown) which is supported by a bearing saddle 335 mounted on the post 135. Bearing saddle cap 340 is bolted or otherwise fastened to bearing saddle 335 to retain the bearing in position. With this arrangement, posts 135 with attached bearing saddles 335 may be placed in the desired positions, torque tube 130 may then be placed in position with its bearings resting in bearing saddles 335, and then bearing saddle caps 340 may be attached to secure the torque tube in place.

Bearing saddle 335 and bearing saddle cap 340 may be formed from cast or machined steel, for example. Any other suitable material may also be used. Any suitable bearings of any suitable materials may be used in the arrangement just described.

Posts 135 may be placed at intervals along torque tube 130 of, for example, about 2.4 meters to about 12 meters, typically about 5.5 meters. In the illustrated example, posts 135 are steel I-beams, but any suitable post configuration to which a bearing saddle 335 may be attached may also be used. This flexibility in choice of post configuration allows posts 135 to be adapted to soil conditions. For example, posts 135 may be pounded posts or may be adapted to be set in or attached to concrete foundations.

Referring again to FIGS. 10A-10C, in the illustrated example bearing saddle 335 comprises a narrow neck 345 located below the rotation axis of the collector. Referring now to FIG. 11, neck 345 provides additional clearance for longitudinal reflector supports located beneath reflector 120, allowing reflector 120 to be rotated over a greater angular range in both rotational directions than would be the case if bearing saddle 335 did not include neck 345.

Although the post-mounting arrangement for torque tube 130 just described may be advantageous, any other suitable mounting arrangement may also be used.

As noted above, in the illustrated example the reflector subsection in each module comprises four reflector-panel assemblies 180, though any other suitable number of reflector-panel assemblies may also be used. Referring now to FIGS. 12A-12D, each reflector-panel assembly comprises a plurality of linearly extending reflective elements 190 arranged side-by side on a flexible panel 350. Flexible panel 350 maintains a flat configuration (FIG. 12C) if no external forces are applied to it, but may be flexed to assume a curved (e.g., parabolic or approximately parabolic) shape desired for reflector 120 by forces applied to the reflector-panel assembly by reflector supports. Gaps 355 (FIG. 12D) between adjacent reflective elements 190 are dimensioned, for example, to provide clearance that allows panel 350 to be bent into the desired curved profile without contact occurring between adjacent reflective elements. Panels 350 may bend primarily along regions corresponding to gaps 355, and may optionally be weakened along those regions by scoring or grooving, for example, to further facilitate bending. Panels 350 may be formed from steel sheet, for example, and when flat may have a width perpendicular to the long axes of reflective elements 190 of, for example, about 300 mm to about 1500 mm, typically about 675 mm, and a length parallel to the long axes of reflective elements 190 of, for example, about 600 mm to about 3700 mm, typically about 2440 mm. Any other suitable materials, dimensions, and configuration may also be used for panel 350.

Linearly extending reflective elements 190 may be attached to flexible panel 350 with, for example, an adhesive that coats the entire back surface of each reflective element 190. The adhesive coating may be applied, for example, directly to a reflective (e.g., silver and/or copper) layer located on the back surface of reflective element 190 or to a protective layer on the reflective layer. In such variations, the adhesive layer may protect the reflective layers from corrosion in addition to attaching the reflective elements to the panel. The use of such a protective adhesive layer may advantageously reduce any need to apply other protective coatings, such as paint layers, to the back surfaces of the reflective layers. The adhesive may be, for example, a spray-on adhesive such as, for example, 3M™ 94 CA spray adhesive available from 3M, Inc. The adhesive layer may have a thickness of, for example, about 0.05 mm to about 0.5 mm, typically about 0.2 mm. Any other suitable adhesive, any suitable fastener, or any other suitable fastening method may also be used to attach reflective elements 190 to panel 350.

Referring again to FIGS. 12A-12D, each reflector-panel assembly 180 also comprises a plurality of longitudinal reflector supports 360 attached to the underside of panel 350 and running parallel to the long axes of reflective elements 190. As described in more detail below, in an assembled solar energy collector 100 the longitudinal reflector supports 360 are oriented perpendicularly to and attached to transverse reflector supports 140. Longitudinal reflector supports 360 thereby provide strength and rigidity to reflector-panel assemblies 180, and thus to reflector 120, along the rotational axis of the collector.

Figure 12D:
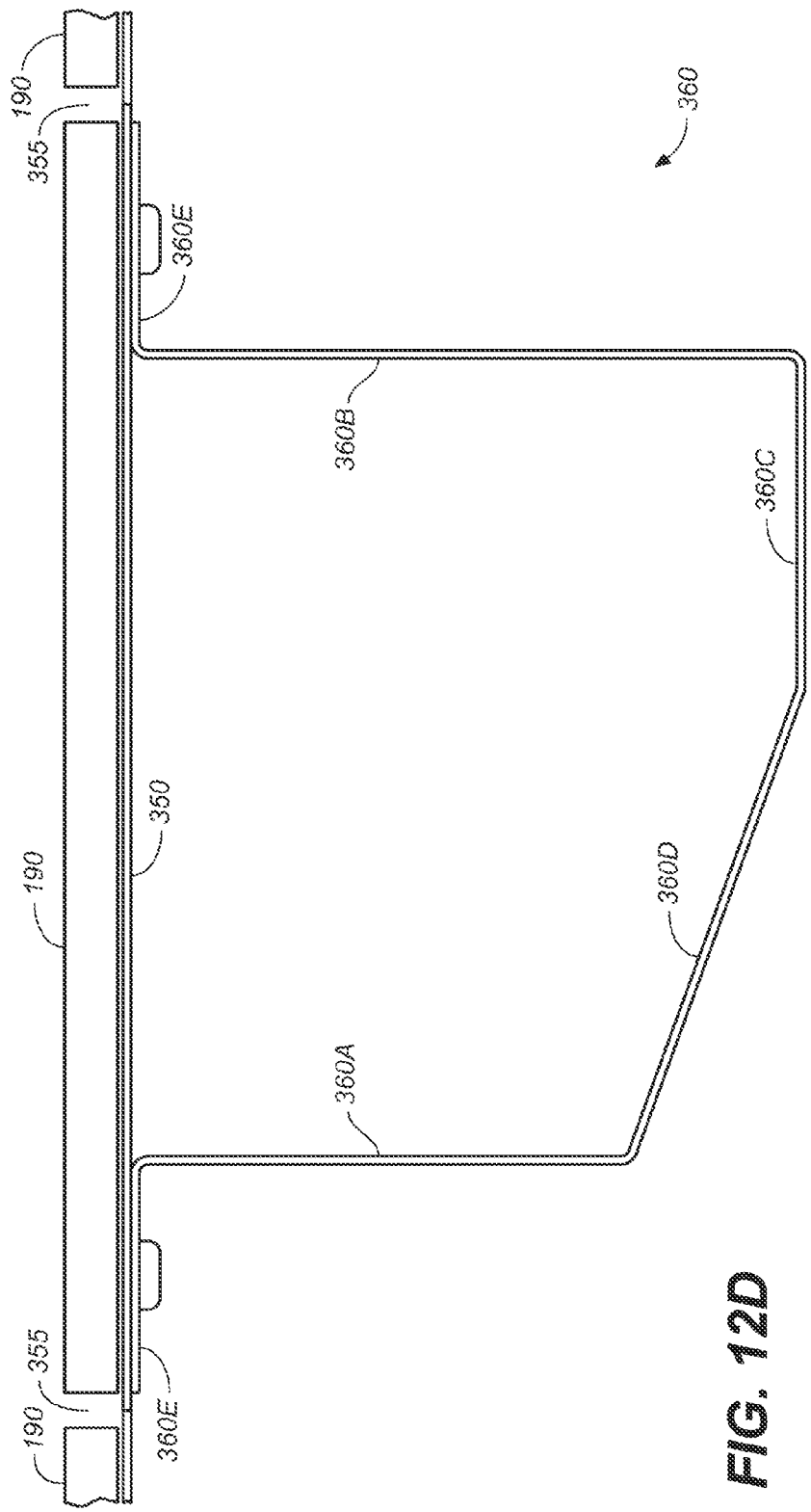
FIG. 12D shows a close-up cross-sectional view of a portion of the example reflector-panel assembly.

Referring now particularly to FIG. 12D, in the illustrated example each longitudinal reflector support 360 is formed from sheet steel into a trough-like configuration having a cross-section defined by parallel side walls 360A and 360B, a bottom panel 360C oriented perpendicularly to side wall 360B, and an angled bottom wall 360D forming obtuse angles with bottom panel 360C and side wall 360A. In addition, each reflector support 360 comprises flange panels 360E extending perpendicularly outward from side walls 360A and 360B. In the illustrated example, flange panels 360E of longitudinal reflector supports 360 are attached to flexible panel 350 with rivets 365. Any other suitable fastener, any suitable adhesive, or any other suitable fastening method may also be used to attach longitudinal reflector supports 360 to flexible panel 350. Longitudinal reflector supports 360 may be attached to flexible panel 350 with clinch joints, for example. Angling bottom wall 360D as illustrated allows the longitudinal reflector supports 360 located nearest the torque tube to fit better into the clearance created by neck region 345 of bearing saddle 335, as illustrated in FIG. 11.

To facilitate bending of flexible panel 350 at gaps 355 between reflective elements 190, each longitudinal reflector support 360 may be arranged to underlie a single reflective element 190 as shown in FIG. 12D. Alternatively, longitudinal reflector supports 360 may be arranged to bridge gaps 355 between reflective elements 190.

Longitudinal reflector supports 360 may have a length of, for example, about 600 mm to about 3700 mm, typically about 2375 mm, a depth (panel 350 to bottom wall 360C) of, for example, about 25 mm to about 150 mm, typically about 50 mm, and a width (wall 360A to wall 360B) of, for example, about 25 mm to about 150 mm, typically about 75 mm. Any other suitable materials, dimensions, and configurations for longitudinal reflector supports 360 may also be used.

In the illustrated example each reflector-panel assembly 180 is attached to and supported at its ends by a pair of adjacent transverse reflector supports 140 to thereby form a portion of reflector 120 spanning a single reflector subsection. Suitable methods and arrangements for accomplishing this may include those disclosed, for example, in U.S. patent application Ser. No. 13/619,881, filed Sep. 14, 2012, titled "Solar Energy Collector"; U.S. patent application Ser. No. 13/619,952, filed Sep. 14, 2012, also titled "Solar Energy Collector"; U.S. patent application Ser. No. 13/633,307, filed Oct. 2, 2012, also titled "Solar Energy Collector"; and U.S. patent application Ser. No. 13/651,246, filed Oct. 12, 2012, also titled "Solar Energy Collector"; all of which are incorporated herein by reference in their entirety. Any other suitable method or arrangement may also be used.

Figure 13A:
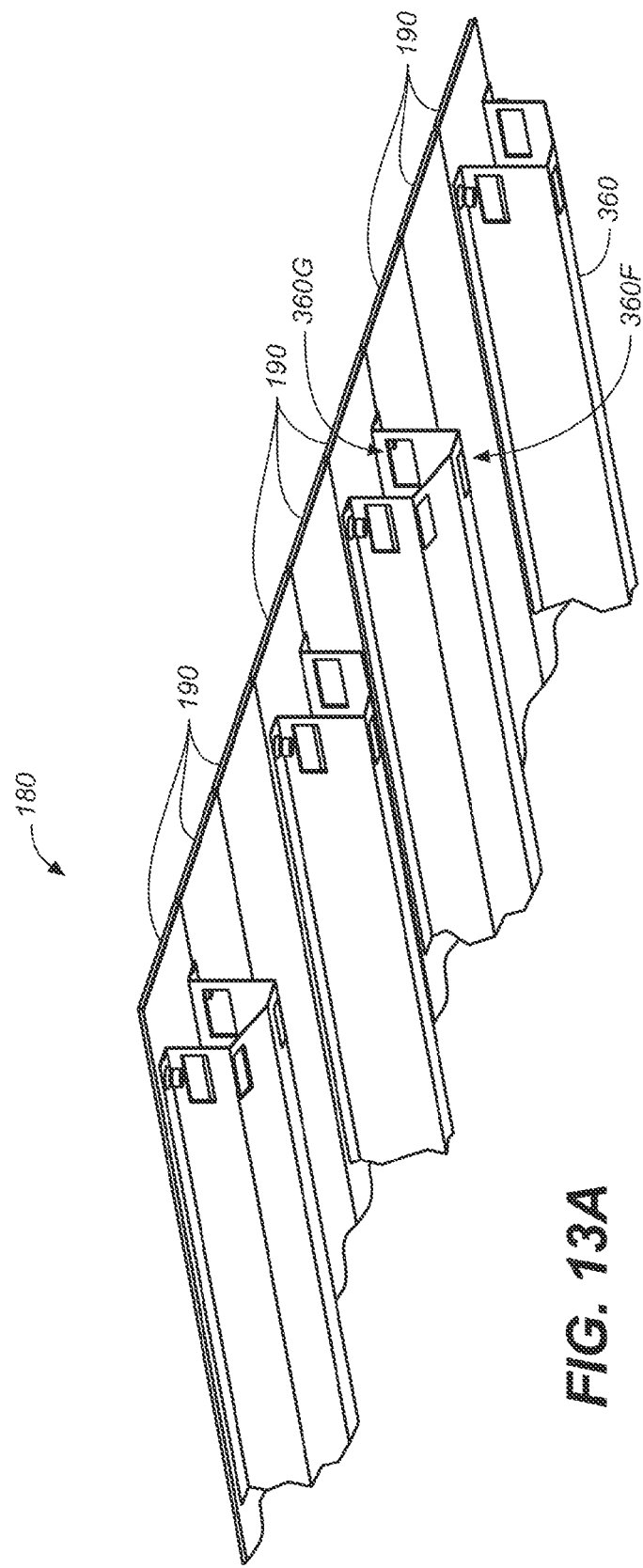
FIG. 13A shows a perspective view of the underside of an example reflector-panel assembly.
Figure 13B:
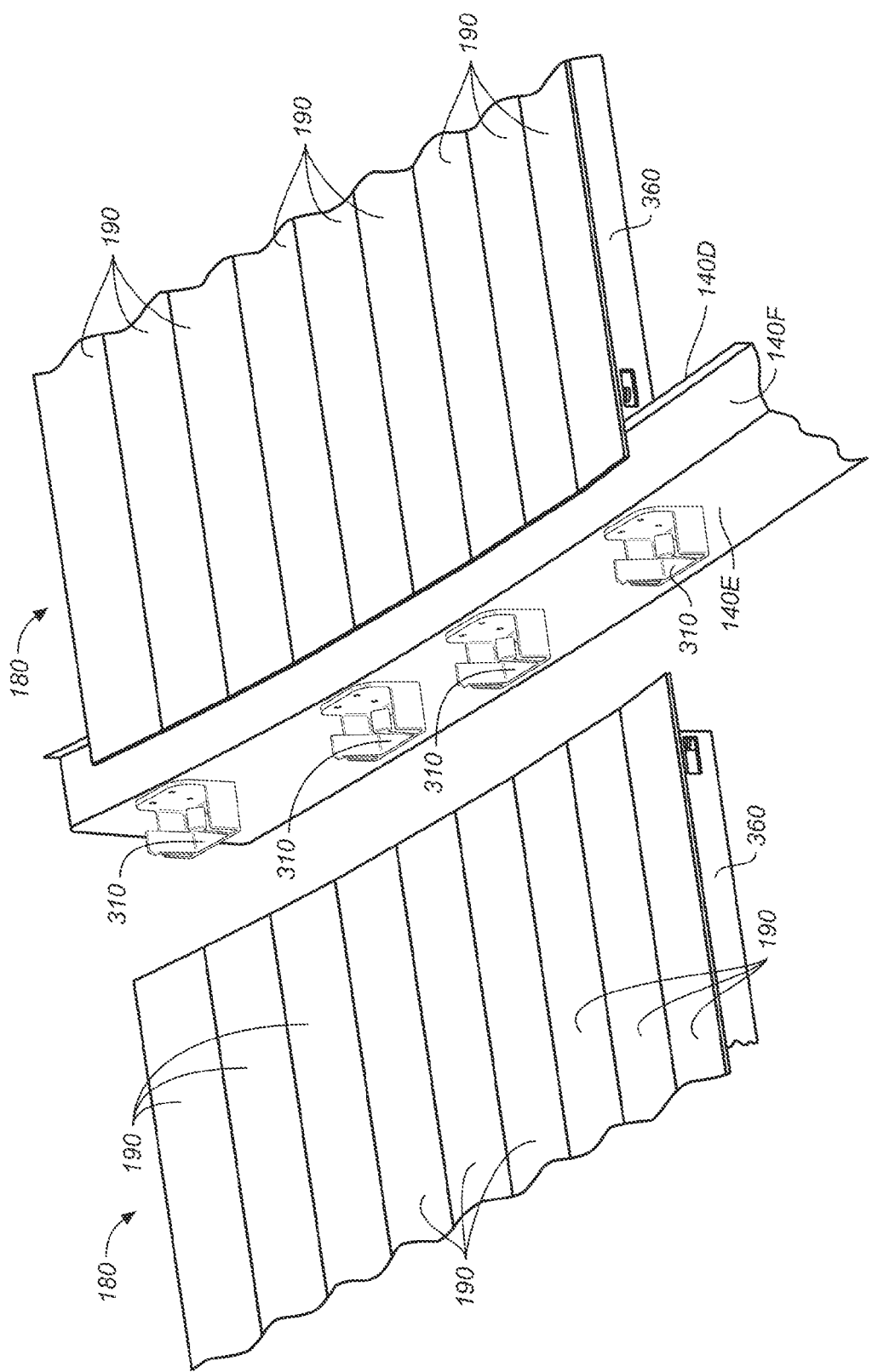
FIG. 13B shows a perspective view of two example reflector-panel assemblies and an example transverse reflector support.

As shown in FIGS. 13A-13B, in the illustrated example opposite ends of the flexible panel 350 of each reflector-panel assembly are supported by the curved edge of a side wall 140D or the curved edge of a side wall 140E (see also FIG. 7B) of a transverse reflector support 140. Longitudinal reflector supports 360 underlying the flexible panel 350 are attached to joist-hangers 310 on the transverse reflector support 140. Thus attached, longitudinal reflector supports 360 and joist hangers 310 pull the ends of flexible panel 350 against the curved supporting edges of side walls 140D and 140E of the transverse reflector supports 140, forcing flexible panel 350 to conform to the shapes of those supporting edges and thereby orienting reflective elements 190 on flexible panel 350 to form a reflector having the desired curvature. As shown in FIG. 13B, each transverse reflector support 140 located at an intermediate position in solar energy collector 100 supports reflector-panel assemblies from two adjacent reflector subsections. Transverse reflector supports located at the ends of a solar energy collector 100 necessarily support reflector-panel assemblies from only one reflector subsection.

Longitudinal reflector supports 360 may be attached to joist hangers 310 with any suitable fastener, adhesive, or other fastening method. As in the illustrated example, further discussed below, longitudinal reflector supports 360 may snap-on to joist hangers 310 through the engagement of any suitable complementary interlocking features on supports 360 and on joist hangers 310. One or both of the complementary interlocking features may be configured to have sufficient elasticity to flex to allow a support 360 to be installed in a joist hanger 310 and then provide restoring forces that retain the complementary features in an interlocked configuration. Suitable complementary interlocking features may include, for example, tabs and slots, hooks and slots, protrusions and recesses, and spring clips and slots.

Figure 14A:
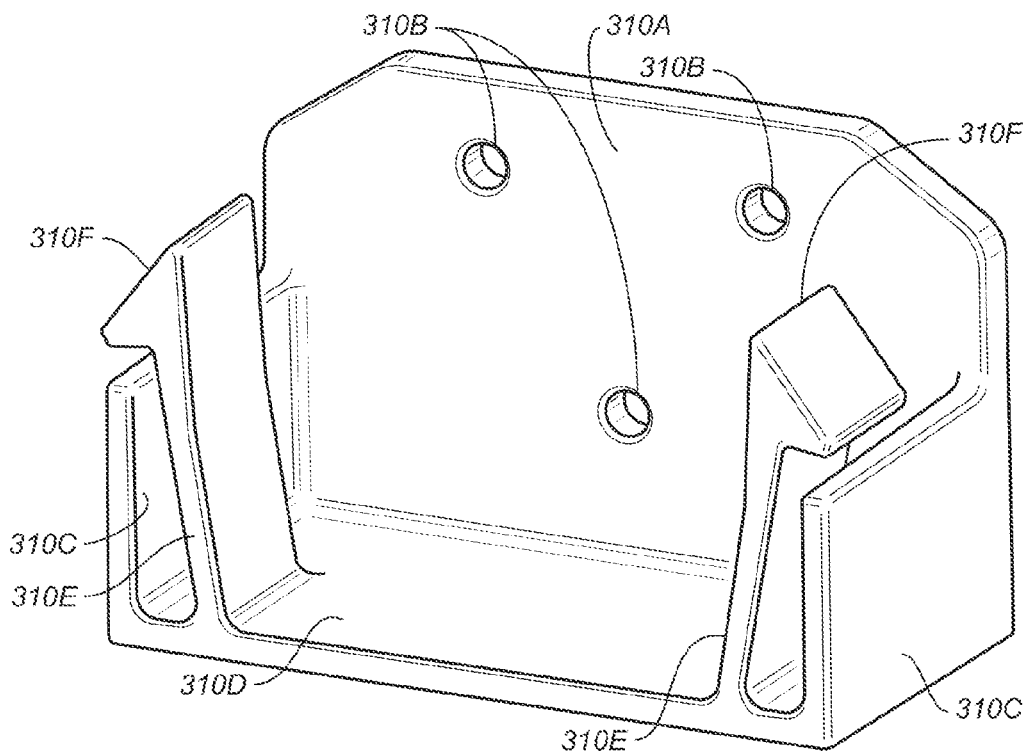
FIGS. 14A-14B show, respectively, perspective and plan views of an example joist hanger configured to attach a longitudinal reflector support in an example reflector-panel assembly to an example transverse reflector support.
Figure 14B:
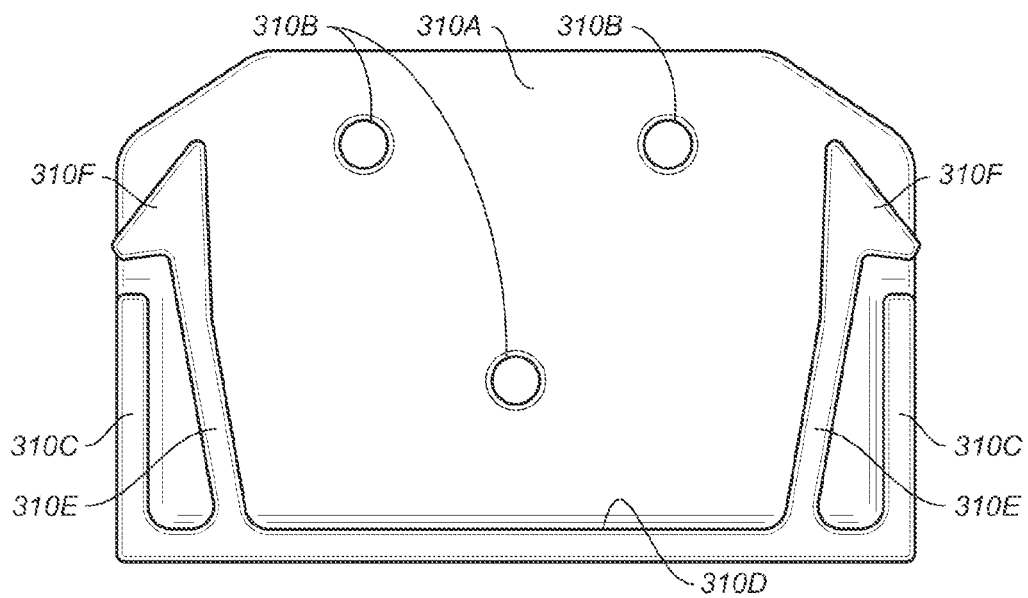

Referring now to FIGS. 14A-14B, in the illustrated example each joist hanger 310 comprises a back wall 310A to be attached to a transverse reflector support via fastener openings 310B, side walls 310C attached to opposite sides of back wall 310A and oriented perpendicularly outward from back wall 310A, bottom wall 310D attached to and oriented perpendicularly to back wall 310A and to side walls 310C, and elastic spring clips 310E each attached to bottom wall 310 adjacent to and angling toward a corresponding side wall 310C. Each spring clip 310E has a triangle shaped protrusion 310F that projects outward toward the nearest side wall 310C.

Referring again to FIGS. 13A-13B as well as to FIGS. 14A-14B, the end of each longitudinal reflector support 360 comprises bottom slots 360F and side slots 360G. During snap-on attachment of a longitudinal reflector support 360 to a joist hanger 310, spring clips 310E on the joist hanger are inserted through bottom slots 360F of the longitudinal support 360 until protrusions 310F on the spring clips protrude through and engage side slots 360G on the longitudinal support to retain the longitudinal support in the joist hanger. In this process the spring clips 310E are initially deflected from their equilibrium positions by contact with the inner surfaces of longitudinal support side walls 360A and 360B, then return toward their equilibrium positions when spring clip protrusions 310F snap through side slots 360G. In the latter configuration the bottom surfaces of triangular protrusions 310F engage lower edges of side slots 360G, interlocking the joist hanger and the longitudinal support.

FIG. 15A shows two reflector-panel assemblies 180 attached to a transverse reflector support as just described. In the illustrated example, side slots 360G extend along longitudinal support 360 for a distance greater than the engaged width of joist hanger spring clip protrusion 310F. This allows the spring clip to move along the side slot to accommodate misalignment of, for example, joist hanger 310 or longitudinal support 360.

Joist hangers 310 may be formed, for example, form molded plastic, sheet steel, or any other suitable material. Although the illustrated snap-on configuration just described may be advantageous, any other suitable configuration for joist hangers 310 may also be used. Further, the use of joist hangers 310 is not required. As noted above, any suitable method for attaching reflector-panel assemblies 180 to transverse support 140 may be used.

Two coplanar reflector-panel assemblies arranged in line along the rotation axis and attached end-to-end to a shared transverse reflector support 140 are generally spaced apart by a small gap to accommodate thermally induced expansion and contraction of the collector and to provide mechanical design tolerances. The gap between the reflector-panel assemblies does not reflect light and consequently behaves like a shadow on the reflector, which may be projected by the reflector onto the receiver. The shadow on the receiver resulting from the gap may degrade performance of solar cells on the receiver similarly to as described above with respect to shadows cast by receiver supports.

Referring now to FIGS. 15A-15C, in the illustrated example two reflector-panel assemblies are arranged in line along the rotation axis and attached to a shared transverse reflector support 140 with their adjacent ends vertically offset from each other along the optical axis of the reflector, rather than coplanar. The vertical offset of the adjacent ends of the reflector-panel assemblies occurs because they are supported by transverse reflector support side walls 140D and 140E of different heights. This vertical offset allows the adjacent ends of the reflector-panel assemblies to be placed closer together or even to overlap as shown in FIGS. 15B-15C, without risk of mechanical interference between the adjacent reflector-panel assemblies. Typically, the lower reflector-panel assembly end is positioned under the upper reflector-panel assembly end.

In the illustrated example, each reflector-panel assembly is supported at one end by a tall side wall 140D of one transverse reflector support 140, and at the other end by a short side wall 140E of another transverse reflector support 140, with adjacent ends of the reflector-panel assemblies vertically offset rather than coplanar. As shown in FIG. 15B, for example, the reflector-panel assemblies may be arranged in a repeating pattern in which all of the reflector-panel assemblies are tilted in the same direction and adjacent ends of reflector-panel assemblies are vertically offset and optionally overlapped in a pattern similar to roof shingles. Typically, the reflector is oriented so that the higher end of each reflector-panel assembly is closer to the equator than is its lower end.

If reflective elements 190 are front surface reflectors, then in the offset reflector-panel geometry just described parallel rays 370A and 370B (FIGS. 15B-15C) may be reflected from the ends of adjacent reflector-panel assemblies with no gap between the rays regardless of the position of the sun in the sky. If instead reflective elements 190 are rear surface reflectors, then parallel rays 370A and 370B may be reflected from the ends of adjacent reflector-panel assemblies with a gap 375 resulting from the side edge of the upper reflector-panel assembly blocking reflection from the lower reflector-panel assembly. When the sun is located directly above the reflector, gap 375 has zero width. If the reflector is oriented so that the higher end of each reflector-panel assembly is closer to the equator than is its lower end, then for other sun positions the width of gap 375 depends only on the sun position and on the thickness of the upper transparent layer (e.g., glass) on the rear surface reflector. The width of gap 375 may therefore be minimized by minimizing the thickness of the transparent layer on the reflector. If the reflector-panel assemblies were coplanar rather than having vertically offset ends, then gap 375 would include a contribution from the physical gap along the rotation axis between the ends of the reflector-panel assemblies as well as a contribution from the side edge of one reflector blocking reflection from the adjacent reflector. Consequently, in the illustrated example gap 375 may advantageously be smaller than would be the case for coplanar reflector-panel assemblies.

Non-uniform illumination of the receiver resulting from gaps between reflector-panel assemblies may also be reduced or eliminated by shaping the ends of reflector-panel assemblies to spread reflected light into what would otherwise by a shadow on the receiver resulting form the gap. For example, ends of otherwise coplanar reflector-panel assemblies may curve or bend downward (away from the incident light), so that light rays are reflected in a crossing manner from the ends of the adjacent reflector-panel assemblies toward the receiver, blurring the shadow from the gap.

This disclosure is illustrative and not limiting. Further modifications will be apparent to one skilled in the art in light of this disclosure and are intended to fall within the scope of the appended claims.

What is claimed is:

1. A solar energy collector comprising:
a linearly extending receiver comprising solar cells;
a linearly extending reflector oriented parallel to a long axis of the receiver and fixed in position with respect to the receiver; and
a linearly extending support structure supporting the receiver and the reflector and pivotably mounted to accommodate rotation of the support structure, the reflector, and the receiver about a rotation axis parallel to the long axis of the receiver to concentrate solar radiation onto the solar cells;

wherein the support structure comprises a plurality of receiver supports arranged to support the receiver above the reflector, and each of the receiver supports is tilted in a same direction along the rotation axis;

wherein the reflector comprises a plurality of reflector-panel assemblies, each reflector-panel assembly comprising a plurality of linearly extending reflective elements arranged side-by-side on an upper surface of a flexible panel and oriented parallel to the rotation axis;

wherein each reflector-panel assembly comprises a plurality of longitudinal reflector supports arranged under the flexible panel and oriented parallel to the linearly extending reflective elements; and wherein the solar energy collector comprises a plurality of transverse reflector supports extending away from the rotation axis to support the reflector and a plurality of hanger joists attached to each transverse reflector support, wherein ends of the longitudinal reflector supports are attached to and supported by the hanger joists.

2. The solar energy collector of claim 1, wherein the solar cells are arranged on a surface of the receiver oriented perpendicularly to optical axes of the reflector.

3. The solar energy collector of claim 1, wherein the plurality of receiver supports comprises a plurality of primary receiver supports and a plurality of secondary receiver supports, the primary receiver supports are in compression, and the secondary receiver supports are under tension.

4. The solar energy collector of claim 3, wherein the secondary receiver supports are thinner than the primary receiver supports.

5. The solar energy collector of claim 3, wherein the primary receiver supports are arranged in mirror image pairs along the rotation axis.

6. The solar energy collector of claim 5, wherein the secondary receiver supports are arranged along the rotation axis in an alternating manner with longitudinally adjacent secondary receiver supports on opposite sides of the rotation axis.

7. The solar energy collector of claim 1, wherein the receiver supports are coupled to the receiver with hinged brackets.

8. The solar energy collector of claim 7, wherein the hinged brackets have two pivot axes each of which is oriented perpendicular to the rotation axis.

9. The solar energy collector of claim 1, comprising an end receiver support at each end of the solar energy collector, the end receiver supports extending parallel to optical axes of the reflector to support outer ends of the receiver above the reflector.

10. The solar energy collector of claim 1, wherein the lower ends of the receiver supports are attached to outer ends of corresponding transverse reflector supports.

11. The solar energy collector of claim 1, wherein the receiver comprises a plurality of linearly extending receiver subsections coupled end-to-end, each receiver subsection comprises one or more fluid channels accommodating flow of a heat transfer fluid through the receiver subsection along its long axis, and fluid interconnections between the receiver subsections are rigid and in line with the receiver subsections.

12. The solar energy collector of claim 11, wherein the receiver supports are coupled to the receiver with hinged brackets.

13. The solar energy collector of claim 1, wherein the receiver comprises one or more fluid channels accommodating flow of a heat transfer fluid through the receiver, comprising a heat exchanger at least partially shaded by the solar energy collector during operation of the solar energy collector.

14. The solar energy collector of claim 13, wherein the heat exchanger is a passive heat exchanger attached to and rotating with the support structure.

15. The solar energy collector of claim 14, wherein the passive heat exchanger comprises finned tubes shaded by the reflector during operation of the solar energy collector.

16. The solar energy collector of claim 14, wherein the receiver comprises heat-exchanger fins.

17. The solar energy collector of claim 1, wherein the longitudinal reflector supports snap on to the hanger joists, with features on the longitudinal reflector supports interlocking with complementary features on the hanger joists.

18. The solar energy collector of claim 1, wherein attachment of the longitudinal reflector supports to the hanger joists forces ends of the flexible panels against curved edges of the transverse reflector supports to thereby impose a desired reflector curvature on the reflector-panel assemblies.

19. The solar energy collector of claim 1, wherein the reflector-panel assemblies are arranged end-to-end in line along the rotation axis with ends of adjacent reflector-panel assemblies vertically offset with respect to each other to form a repeating pattern of tilted reflector-panel assemblies.

20. The solar energy collector of claim 1, wherein the offset ends of adjacent reflector-panel assemblies overlap.

21. The solar energy collector of claim 1, comprising a torque tube defining the rotation axis and a plurality of support posts supporting the torque tube above an underlying surface, wherein each support post comprises a neck region below the rotation axis which provides clearance for a portion of the support structure and thereby extends the angular range over which the support structure may be rotated.

22. The solar energy collector of claim 1, wherein:
the solar cells are arranged on a surface of the receiver oriented perpendicularly to the optical axes of the reflector;
the lower ends of the receiver supports are attached to outer ends of corresponding transverse reflector supports and the upper ends of the receiver supports are coupled to the receiver with hinged brackets; and
the plurality of receiver supports comprises a plurality of primary receiver supports and a plurality of secondary receiver supports, the primary receiver supports are in compression, and the secondary receiver supports are under tension.

23. The solar energy collector of claim 22, comprising an end receiver support at each end of the solar energy collector, the end receiver supports extending parallel to optical axes of the reflector to support outer ends of the receiver above the reflector.

24. The solar energy collector of claim 23, wherein the reflector-panel assemblies are arranged end-to-end in line along the rotation axis with ends of adjacent reflector-panel assemblies vertically offset with respect to each other to form a repeating pattern of tilted reflector-panel assemblies.

25. The solar energy collector of claim 23, wherein the receiver comprises a plurality of linearly extending receive subsections coupled end-to-end, each receiver subsection comprises one or more fluid channels accommodating flow of a heat transfer fluid through the receiver subsection along its long axis, and fluid interconnections between the receiver subsections are rigid and in line with the receiver subsections.

26. The solar energy collector of claim 23, wherein the receiver comprises one or more fluid channels accommodating flow of a heat transfer fluid through the receiver, comprising a passive heat exchanger attached to and rotating with the support structure and shaded by the reflector during operation of the solar energy collector.

27. A solar energy collector comprising:
   a linearly extending receiver;
   a linearly extending reflector oriented parallel to a long axis of the receiver and fixed in position with respect to the receiver; and
   a linearly extending support structure supporting the receiver and the reflector and pivotably mounted to accommodate rotation of the support structure, the reflector, and the receiver about a rotation axis parallel to the long axis of the receiver;
   wherein the support structure comprises a plurality of receiver supports and a plurality of hinged receiver brackets, the hinged receiver brackets coupling the receiver to upper ends of the receiver supports, the receiver supports arranged to support the receiver above the reflector;
   wherein the reflector comprises a plurality of reflector-panel assemblies, each reflector-panel assembly comprising a plurality of linearly extending reflective elements arranged side-by-side on an upper surface of a flexible panel and oriented parallel to the rotation axis;
   wherein each reflector-panel assembly comprises a plurality of longitudinal reflector supports arranged under the flexible panel and oriented parallel to the linearly extending reflective elements; and
   wherein the solar energy collector comprises a plurality of transverse reflector supports extending away from the rotation axis to support the reflector and a plurality of hanger joists attached to each transverse reflector support, wherein ends of the longitudinal reflector supports are attached to and supported by the hanger joists.

28. The solar energy collector of claim 27, wherein the receiver comprises solar cells arranged on a surface of the receiver oriented perpendicularly to optical axes of the reflector.

29. The solar energy collector of claim 27, wherein the receiver comprises one or more channels accommodating flow of a heat transfer fluid through the receiver.

30. The solar energy collector of claim 27, wherein the receiver comprises a plurality of linearly extending receiver subsections coupled end-to-end, each receiver subsection comprises one or more fluid channels accommodating flow of a heat transfer fluid through the receiver subsection along its long axis, and fluid interconnections between the receiver subsections are rigid and in line with the receiver subsections.

31. The solar energy collector of claim 29, comprising a heat exchanger at least partially shaded by the solar energy collector during operation of the solar energy collector.

32. The solar energy collector of claim 31, wherein the heat exchanger is a passive heat exchanger attached to and rotating with the support structure.

33. The solar energy collector of claim 32, wherein the passive heat exchanger comprises finned tubes shaded by the reflector during operation of the solar energy collector.

34. The solar energy collector of claim 27, wherein the hinged brackets have two pivot axes each of which is oriented perpendicular to the rotation axis.

35. The solar energy collector of claim 27, wherein lower ends of the receiver supports are attached to outer ends of corresponding transverse reflector supports.

36. The solar energy collector of claim 27, wherein the longitudinal reflector supports snap on to the hanger joists, with features on the longitudinal reflector supports interlocking with complementary features on the hanger joists.

37. The solar energy collector of claim 27, wherein attachment of the longitudinal reflector supports to the hanger joists forces ends of the flexible panels against curved edges of the transverse reflector supports to thereby impose a desired reflector curvature on the reflector-panel assemblies.

38. The solar energy collector of claim 27, wherein the reflector-panel assemblies are arranged end-to-end in line along the rotation axis with ends of adjacent reflector-panel assemblies vertically offset with respect to each other to form a repeating pattern of tilted reflector-panel assemblies.

39. The solar energy collector of claim 38, wherein the offset ends of adjacent reflector-panel assemblies overlap.

40. The solar energy collector of claim 27, comprising a torque tube defining the rotation axis and a plurality of support posts supporting the torque tube above an underlying surface, wherein each support post comprises a neck region below the rotation axis which provides clearance for a portion of the support structure and thereby extends the angular range over which the support structure may be rotated.

41. The solar energy collector of claim 27, wherein:
   the receiver comprises a plurality of linearly extending receiver subsections coupled end-to-end, each receiver subsection comprises one or more fluid channels accommodating flow of a heat transfer fluid through the receiver subsection along its long axis, and fluid interconnections between the receiver subsections are rigid and in line with the receiver subsections; and
   each receiver subsection comprises solar cells arranged on a surface of the receiver subsection oriented perpendicularly to optical axes of the reflector.

42. The solar energy collector of claim 41, wherein the reflector-panel assemblies are arranged end-to-end in line along the rotation axis with ends of adjacent reflector-panel assemblies vertically offset with respect to each other to form a repeating pattern of tilted reflector-panel assemblies.

43. The solar energy collector of claim 41, comprising a passive heat exchanger attached to and rotating with the support structure and shaded by the reflector during operation of the solar energy collector.

* * * * *